(12) United States Patent
Burkhardt et al.

(10) Patent No.: US 9,058,997 B2
(45) Date of Patent: Jun. 16, 2015

(54) PROCESS OF MULTIPLE EXPOSURES WITH SPIN CASTABLE FILMS

(75) Inventors: Martin Burkhardt, Armonk, NY (US); Sean D. Burns, Armonk, NY (US); Matthew E. Colburn, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/449,741

(22) Filed: Apr. 18, 2012

(65) Prior Publication Data

US 2012/0214311 A1  Aug. 23, 2012

Related U.S. Application Data

(63) Continuation of application No. 11/875,798, filed on Oct. 19, 2007, now abandoned.

(51) Int. Cl.

| | |
|---|---|
| *G03C 1/76* | (2006.01) |
| *H01L 21/027* | (2006.01) |
| *H01L 21/033* | (2006.01) |
| *H01L 21/311* | (2006.01) |
| *H01L 21/3213* | (2006.01) |
| *H01L 21/768* | (2006.01) |

(52) U.S. Cl.
CPC ........ *H01L 21/0274* (2013.01); *H01L 21/0334* (2013.01); *H01L 21/0337* (2013.01); *H01L 21/31144* (2013.01); *H01L 21/32139* (2013.01); *H01L 21/76816* (2013.01); *H01L 2221/1021* (2013.01)

(58) Field of Classification Search
USPC ............................... 430/323, 324, 273.1, 328
See application file for complete search history.

(56) References Cited

U.S. PATENT DOCUMENTS

| | | | | |
|---|---|---|---|---|
| 6,015,650 | A * | 1/2000 | Bae ............................... | 430/314 |
| 2007/0287101 | A1* | 12/2007 | Kim et al. ..................... | 430/313 |
| 2008/0160458 | A1* | 7/2008 | Van Ingen Schenau et al. ............................. | 430/322 |
| 2008/0227295 | A1* | 9/2008 | Chen ............................. | 438/691 |
| 2009/0148796 | A1* | 6/2009 | Van Der Heijden et al. . | 430/323 |

* cited by examiner

*Primary Examiner* — Daborah Chacko Davis
(74) *Attorney, Agent, or Firm* — Robert J. Eichelburg; The Law Offices of Robert J. Eichelburg

(57) ABSTRACT

Methods of multiple exposure in the fields of deep ultraviolet photolithography, next generation lithography, and semiconductor fabrication comprise a spin-castable methodology for enabling multiple patterning by completing a standard lithography process for the first exposure, followed by spin casting an etch selective overcoat layer, applying a second photoresist, and subsequent lithography. Utilizing the etch selectivity of each layer, provides a cost-effective, high resolution patterning technique. The invention comprises a number of double or multiple patterning techniques, some aimed at achieving resolution benefits, as well as others that achieve cost savings, or both resolution and cost savings. These techniques include, but are not limited to, pitch splitting techniques, pattern decomposition techniques, and dual damascene structures.

19 Claims, 19 Drawing Sheets

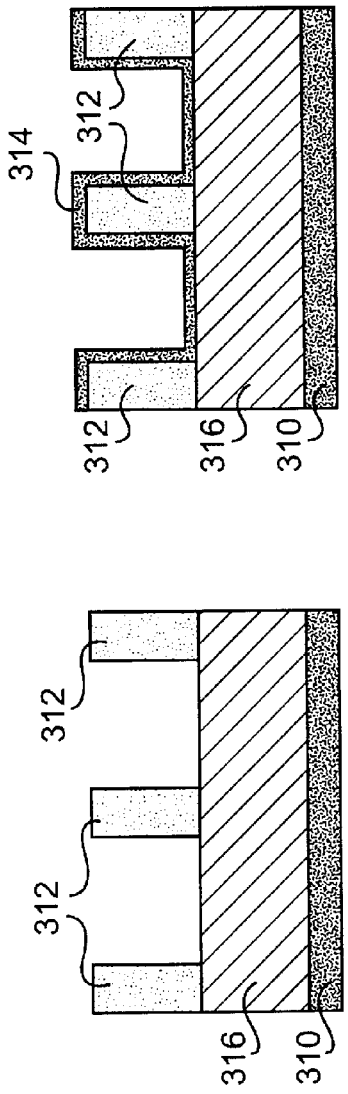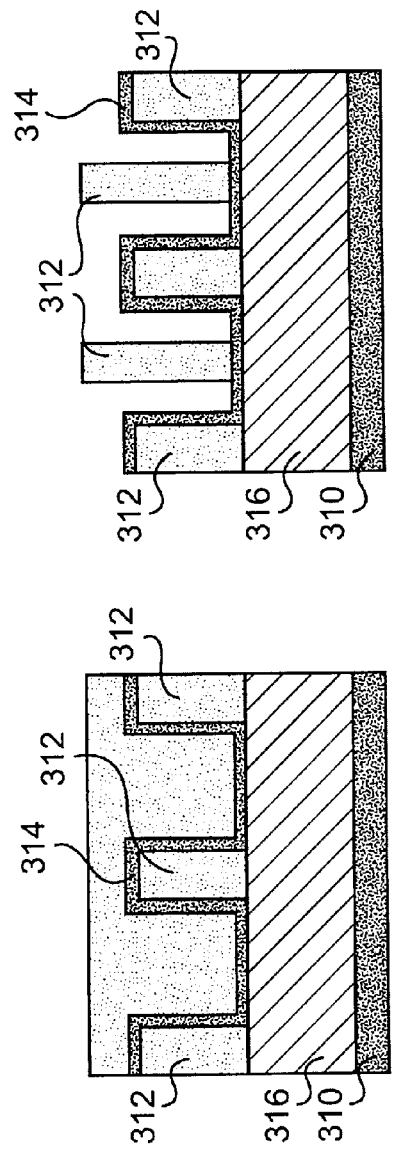
FIG. 3a  FIG. 3b  FIG. 3c  FIG. 3d

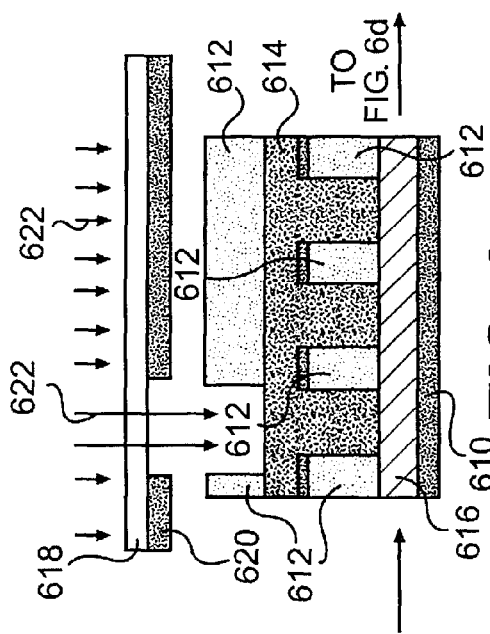
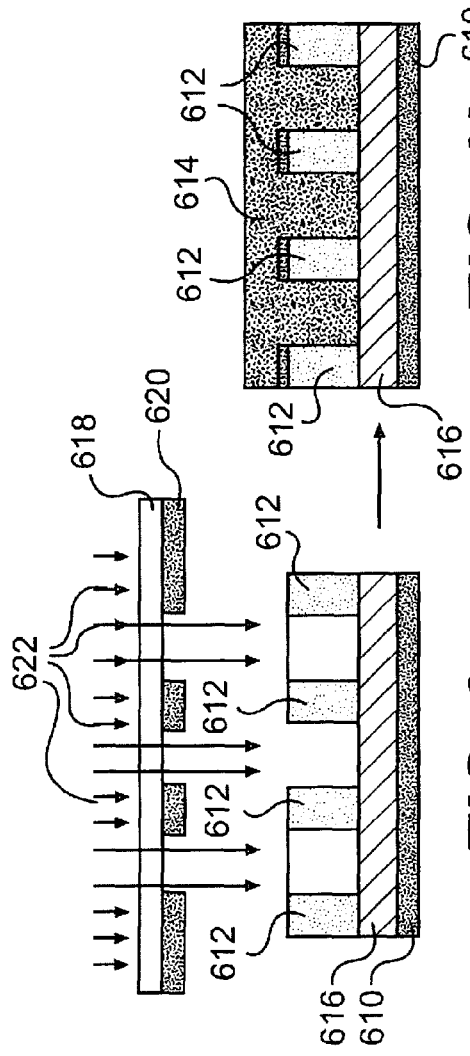
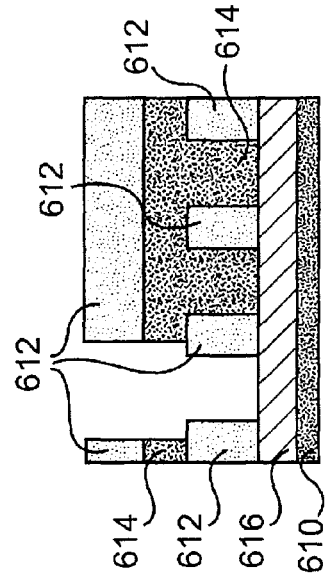
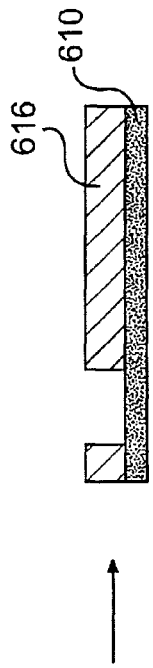

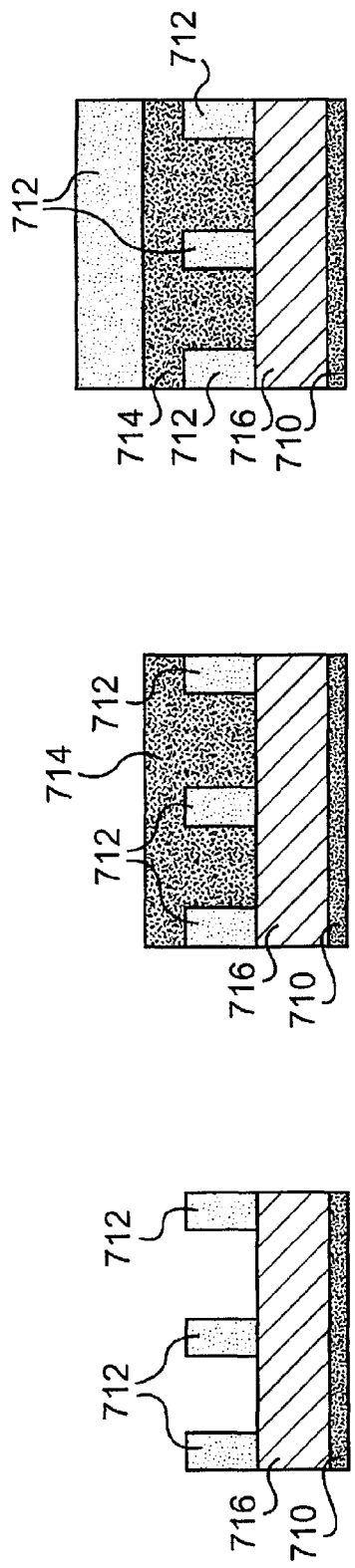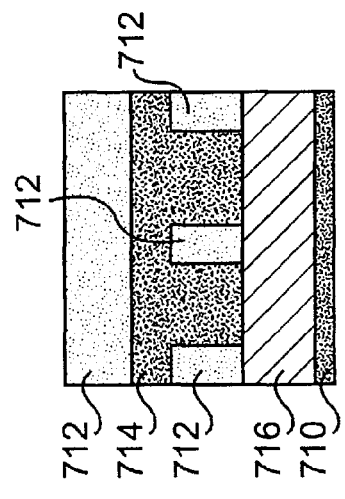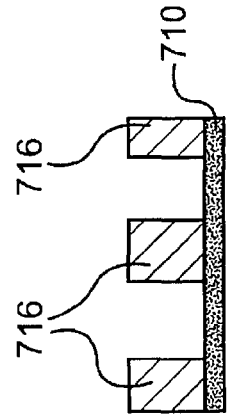
FIG. 7a
FIG. 7b
FIG. 7c
FIG. 7d
FIG. 7e

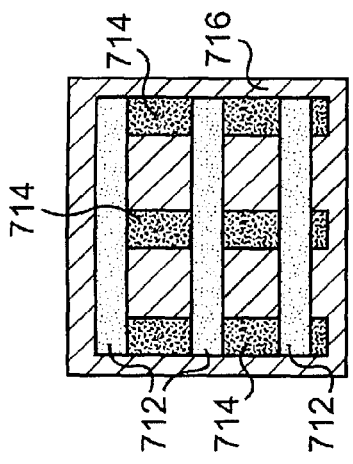
FIG. 7(cp)
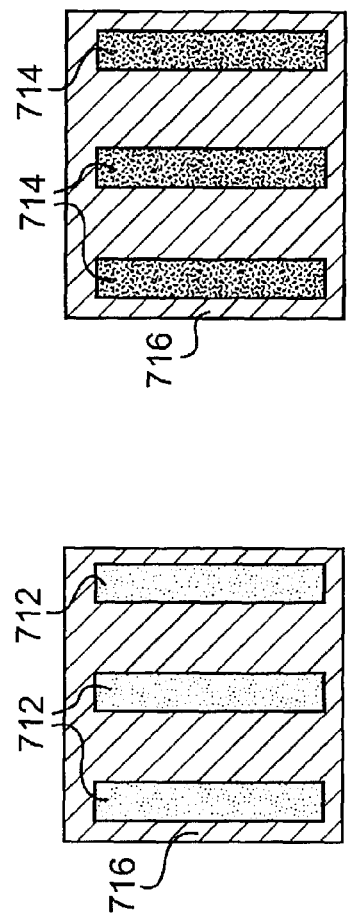
FIG. 7(bp)
FIG. 7(ap)
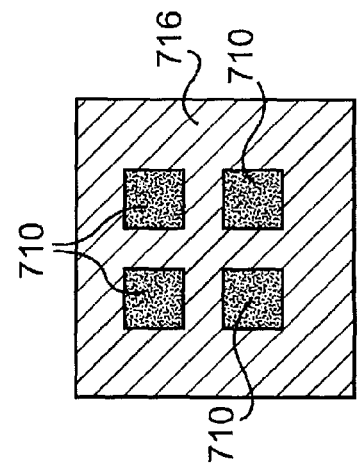
FIG. 7(ep)
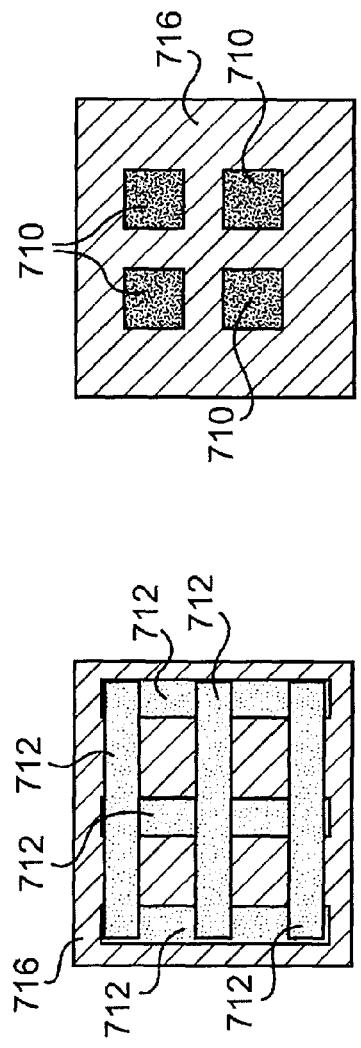
FIG. 7(dp)

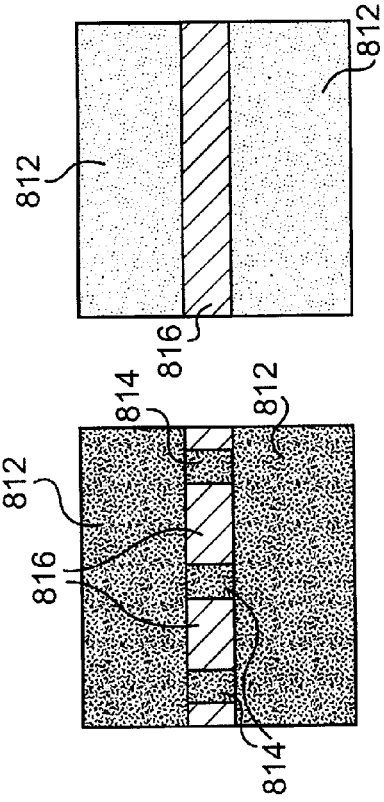
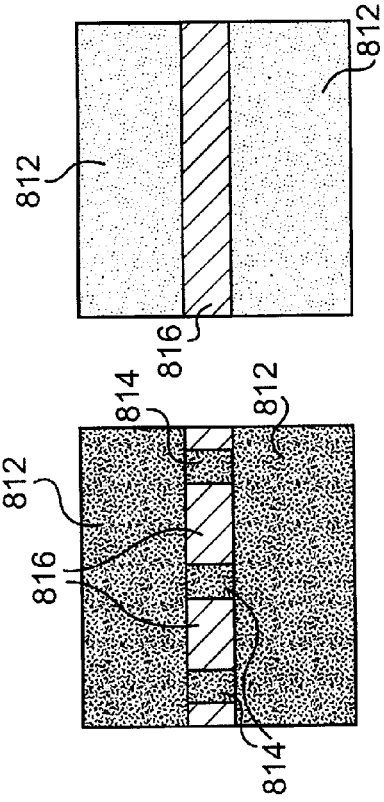
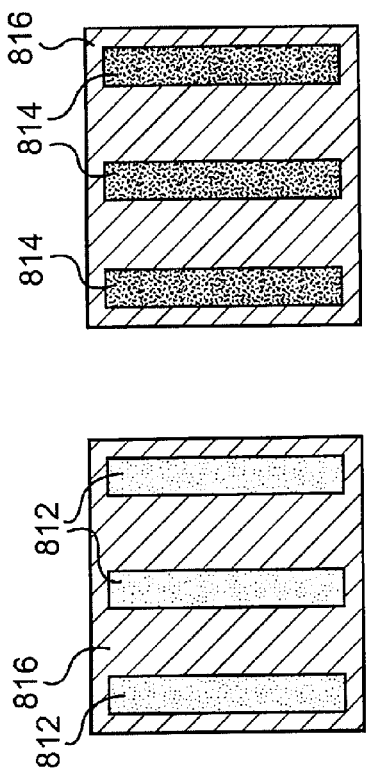
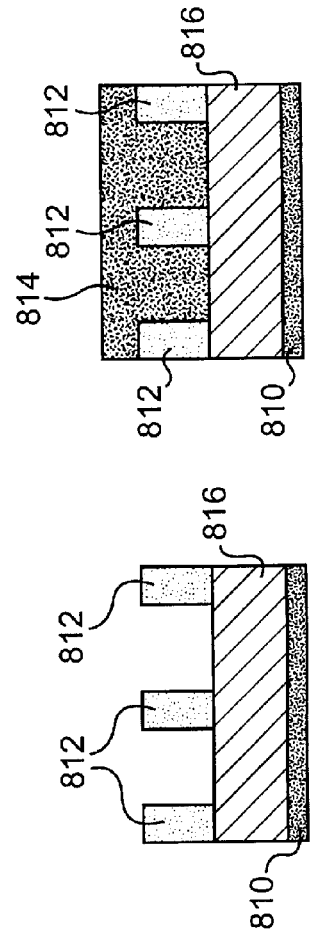
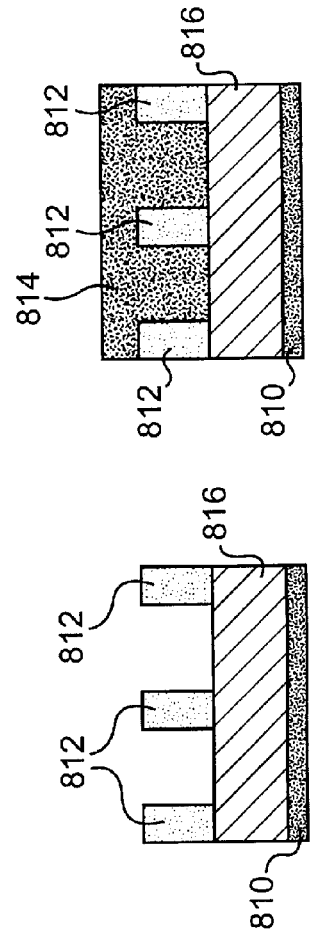
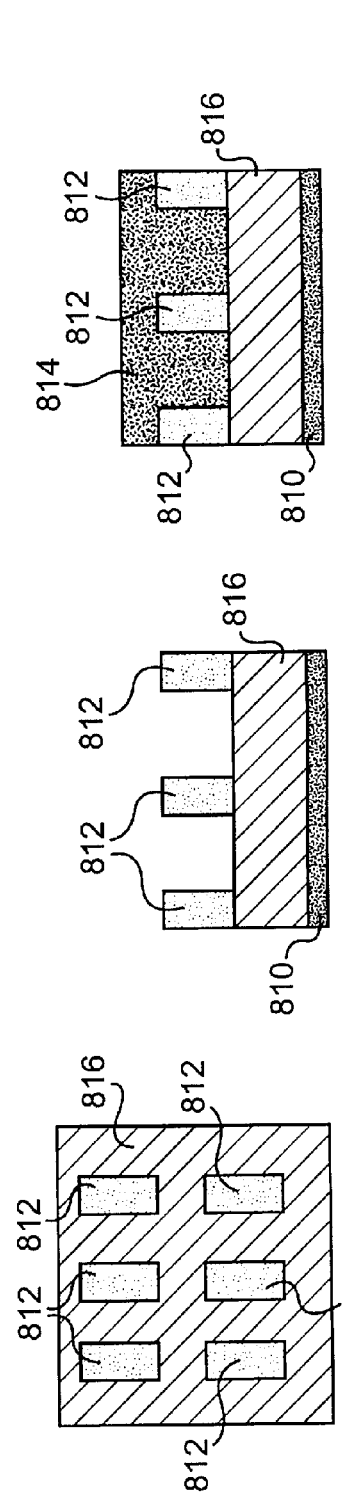

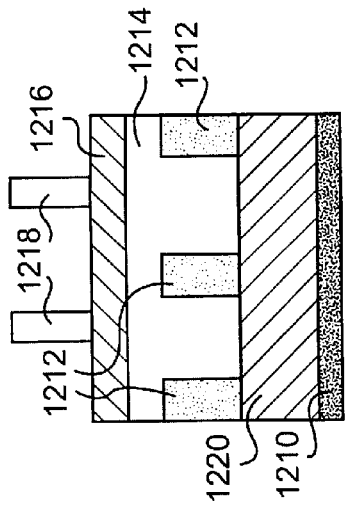
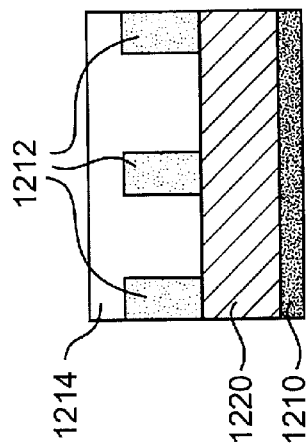
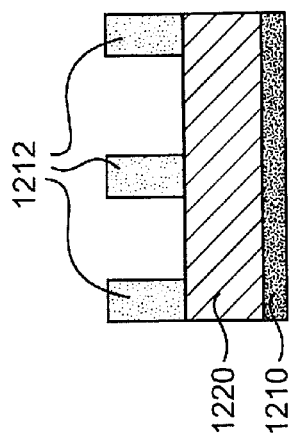
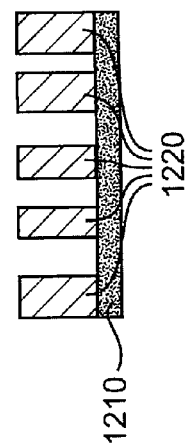
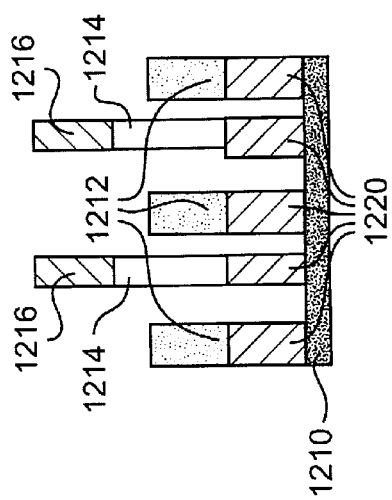
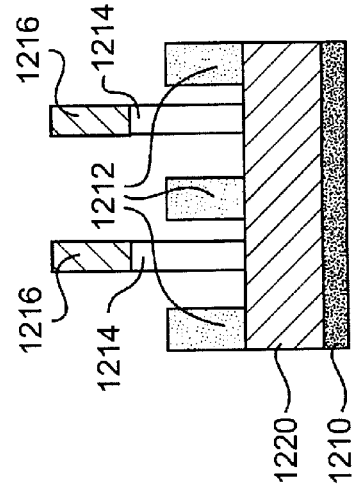

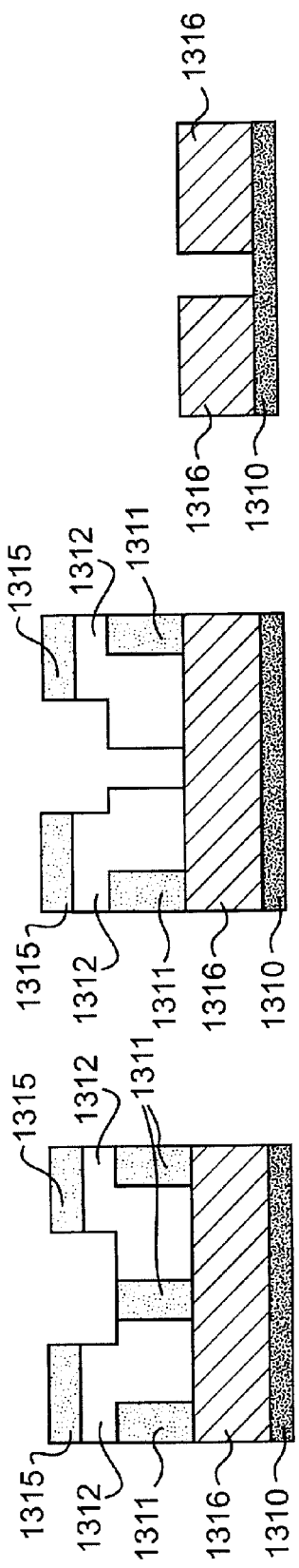
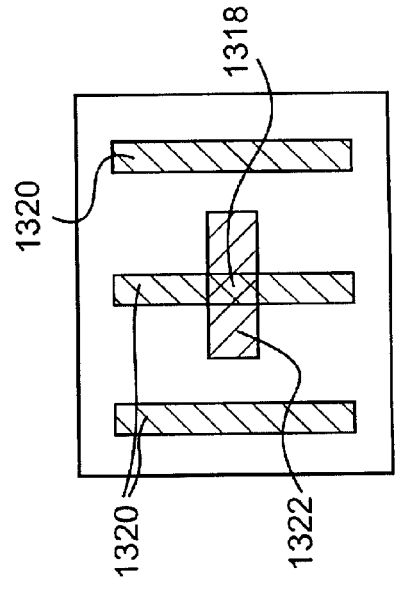
FIG. 13g  FIG. 13h  FIG. 13i
FIG. 13j  FIG. 13k  FIG. 13l

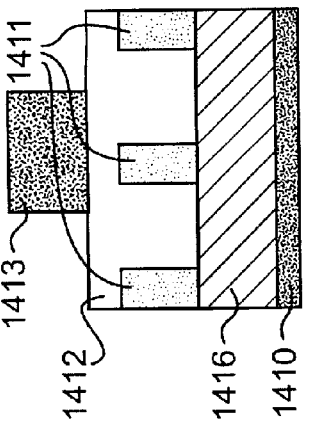
FIG. 14c
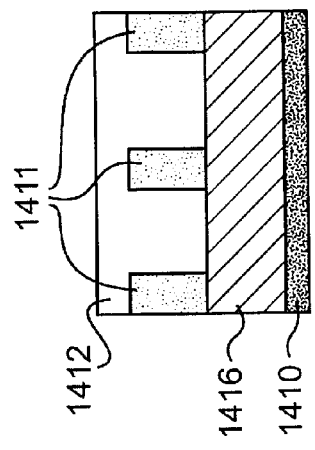
FIG. 14b
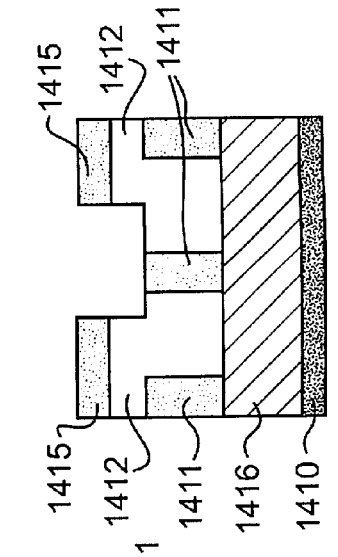
FIG. 14a
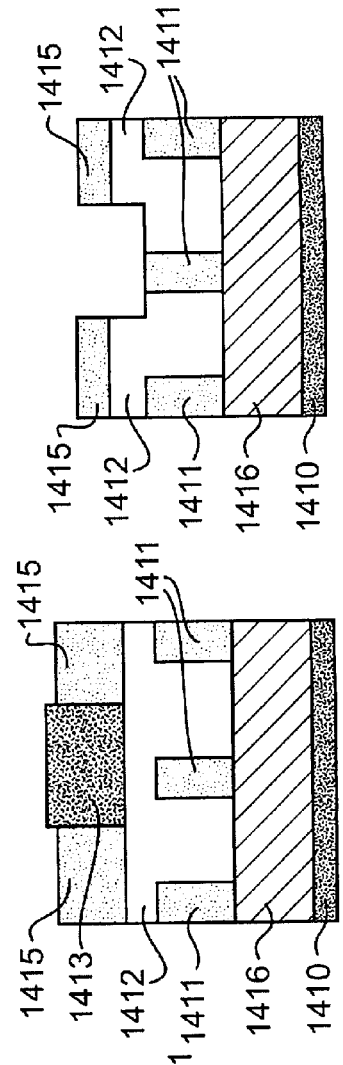
FIG. 14f
FIG. 14e
FIG. 14d
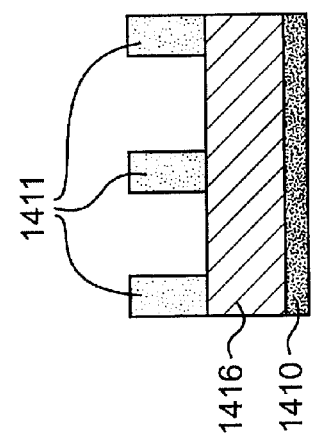
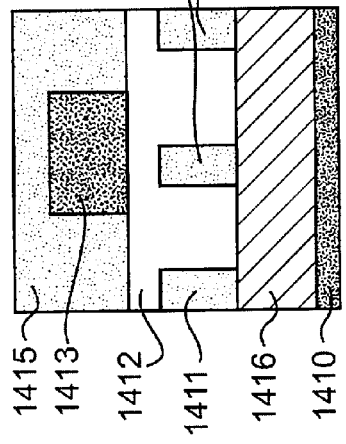

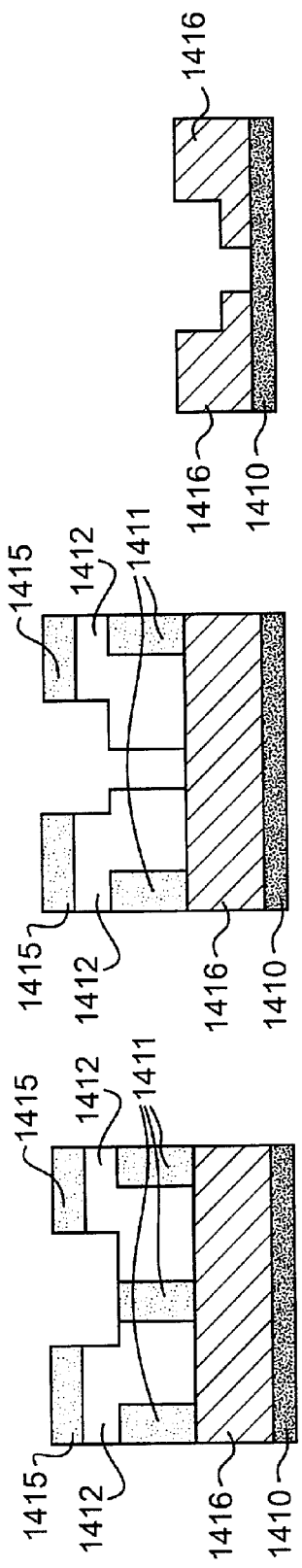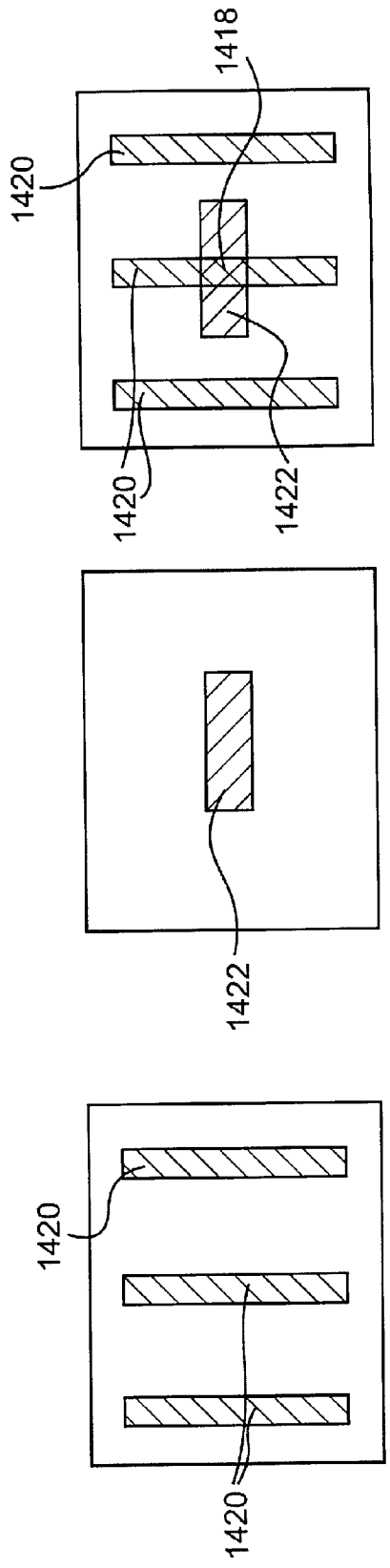

PROCESS OF MULTIPLE EXPOSURES WITH SPIN CASTABLE FILMS

RELATED APPLICATIONS

The present application is a continuation application of parent U.S. patent application Ser. No. 11/875,798 filed on Oct. 19, 2007, said parent application being incorporated herein by reference in its entirety.

FIELD OF THE INVENTION

The field of the invention comprises semiconductor devices, and a process for producing semiconductor devices by techniques that embody semiconductor device resolution enhancement through multiple exposure lithography incorporating intermediate layer patterning.

BACKGROUND OF THE INVENTION

Lithography is one of the most important techniques utilized in semiconductor manufacturing, and is particularly used to define patterns, as for example those employed in a wiring layer patterning process, a device width defining process, or a doped-region defining process. A lithography process generally includes an exposure step and a development step, wherein the exposure step utilizes a light source to irradiate a photoresist layer directly or through a photo mask to induce chemical reactions in exposed portions. The development step is conducted to remove the exposed portion in positive resist (or the unexposed portion in negative resist) and form photoresist patterns, thus completing the transfer of photo mask patterns or virtual patterns to the resist material.

The need to produce integrated circuits of greater complexity and performance has driven designers to shrink the size of minimum features in the horizontal plane. Avoidance of excessive current density, however, has meant that the horizontal scaling has not necessarily been accompanied by a reduction in the vertical dimension. This has resulted in increase of the ratio of feature height to feature width, something generally referred to as aspect ratio. The increased aspect ratio has resulted in problems with the use of conventional single-layer resists in integrated circuitry fabrication.

With lithography pushing to the theoretical limits of resolution the use of double or multiple exposures is beginning to play a more important role. Techniques such as dipole decomposition can allow the lithographer to print features that would not be possible with a single exposure. However, dipole decomposition also has certain limitations. Overlapping dipole decompositions placed within a single resist, limit the pitch and/or resolution of the printed image for certain applications such as contacts. Many of these multiple exposure techniques require an intermediate etch step into a hard mask material. However, the hard mask materials can have integration issues because they can interact with the substrate underneath. In addition, because the hard mask is deposited directly on the substrate, the intermediate etches can cause damage to the substrate itself. Opening the hard mask can also expose the substrate to chemicals and/or materials that adversely affect the substrate. The additional hard mask open step increase costs and throughput.

Accordingly, it would be desirable to be able to enhance the resolution of lithographically patterned features in a manner that does not adversely affect the substrate. It is also desirable to enhance the resolution with as simple and low cost of a technique as possible.

The extension of 193 nm optical lithography to numerical aperture (NA) values above 1.0, enabled by immersion optical projection systems, provides a means of achieving decreased resolution for a printable minimum feature size, and therefore allows for further scaling of integrated circuits (IC) by the semiconductor industry. However, the limits of water immersion are at an NA of ~1.35. To continue resolution scaling beyond an NA of 1.35, double patterning is a technique that does not require new lithographic tools. (S. Brueck "There are No Fundamental Limits to Optical Lithography", *Int. Trends in Applied Optics*, edited by A. Guenther, pp. 85-110, SPIE Press (2002).) Typically, the resolution limit of a lithographic process is defined by the Rayleigh criterion: $R = k \Box/NA$, where R is the smallest possible resolution, $\Box$ is the wavelength of light used, NA is the numerical aperture of the imaging lens, and k is a scaling factor that represents the aggressiveness of the lithographic process. Using a conventional, single exposure lithography process, $k=0.25$ is the limit for resolution scaling, although $k\sim0.35$ is a more practical limit for single exposure lithography (H. Levinson, *Principles of Lithography*, $2^{nd}$ ed, SPIE Press (2005)).

Double or multiple patterning, however, is traditionally an expensive and low throughput methodology for achieving improved resolution, and effectively reducing the k factor. Typical double patterning techniques require a lithography imaging step, followed by a dry reactive ion etch (RIE) step, followed by a second lithography step, and yet a second RIE step as in FIG. 1(a). Many innovative double exposure techniques have the common goal of reducing the number of intermediate steps required to achieve two independent exposures for a single patterning film stack, as shown in FIG. 1(b). The prior art in this field, however, has significant disadvantages addressed by the imaging scheme presented by this invention.

A summary of the general imaging scheme of the present invention is shown in FIG. 2. First, conventional lithography is performed utilizing an appropriate film stack to be patterned, preferably coated with an appropriate optical antireflective coating, and finally coated with a conventional photoresist. The photoresist is imaged using conventional optical lithography processes known in the art. An immersion topcoat and/or top antireflective coating can also be utilized if necessary. Then the post-litho photoresist image is overcoated with a planarizing, etch selective polymeric coating. This planarizing overcoat optionally can be an antireflective coating as well. This layer serves to eliminate the topography issues embedded in many of the double patterning techniques (Owe-Yang, D. C., et al., "Double exposure for the contact layer of the 65 nm node," Proceedings of SPIE, Vol. 5753, p. 171, 2005) This overcoat must not dissolve the underlying developed resist film. This can be accomplished by several mechanisms such as solvent immiscibility, or resist crosslinking. Next, a second photoresist is coated and imaged on top of the etch selective coating, utilizing conventional lithographic imaging. With the second photoresist coating, a bottom or top antireflective coating, an adhesion layer, and/or immersion protective topcoat may also be utilized if necessary. Finally, an integrated reactive ion etch is performed in which both the second and first lithographic images are transferred into the underlying film stack. It's possible to utilize several embodiments of this scheme to achieve a wide array of double exposure schemes.

The invention presented in FIG. 2 is not confined to optical lithography. The scheme can be utilized with several imaging schemes known in the art, including extreme ultraviolet lithography and various next generation lithography schemes including imprint lithography, or directed self-assembly.

There are several imaging schemes known in the art for the purpose of achieving resolution increases with double exposure by the overall process shown in FIG. 1(b). Several of these schemes are outlined by Owe-Yang, D. C., et al., "Double exposure for the contact layer of the 65 nm node," Proceedings of SPIE, Vol. 5753, p. 171, 2005. The first method outlined in this work is called an "isolation layer". It is demonstrated in FIG. 3. In this case, a thin polymeric material is coated conformally over the photoresist image. The residual acid in the photoresist diffuses into this material, catalyzing a crosslinking reaction and forming a protective barrier. The second resist is then applied over the protective layer and imaged traditionally. However, the reference teaches that the isolation layers tested were not suitable due to interaction with the 193 nm photoresists. Furthermore, this scheme suffers from two other issues. Like many similar schemes in prior art, the second photoresist is required to planarize the first image as well as image over topography, and have exceptionally large depth of focus (DOF) to achieve a reasonable pattern. However, immersion lithography is following a trend of continual decreases in depth of focus as the numerical aperture is increased (C. A. Mack, "Exploring the capabilities of immersion lithography through simulation". Proc SPIE 5377, p. 428 (2004)). Imaging methods that require significant topography, and thus significant DOF, are not ideal for semiconductor manufacturing.

A second scheme known in the art is "resist hardening" (Owe-Yang supra; Nakamura et al. "Contact Hole Formation by Multiple Exposure Technique in Ultra-low k1 Lithography," Proceedings of SPIE, Vol. 5377, p. 255, 2004). This scheme is shown in FIG. 4. In the "resist hardening" process, the first resist image is cross linked after the first lithography step by means of a high temperature bake, a UV-cure, or a combination of both processes. Then, a second photoresist is coated over the first image, and patterned conventionally. Finally, an integrated etch step is performed to transfer the composite of both images. This scheme also has several drawbacks. First, the issue mentioned above of topography related DOF concerns in the second image are also present. Second, conventional 193 nm photoresist materials are not conducive to post develop cross linking by the methods taught in the art. An examination of seven common, high performance 193 nm photoresists yielded only one resist that could be cross linked by these methods. Third, typical lithography coating tracks are not equipped to handle a UV cure process. This type of process would require a new tool set (in place of the traditional RIE) so the overall throughput gain is negligible. Finally, the process of crosslinking the first image may result in loss of critical dimension (CD) control.

A third scheme known in the art utilizes photoresists spun-cast from a different type of casting solvent, as shown in FIG. 5. Most often, alcohol soluble photoresists are discussed. (Owe-Yang, supra) In this scheme, the first image is printed conventionally, with a photoresist cast from an organic solvent. Then a second photoresist is applied. However, this new photoresist must be soluble in an alcohol casting solvent, or a casting solvent that is compatible with the first photoresist image. There are three challenges with this technique. First, the topography/DOF issue highlighted above is present. Second, it is difficult with present day photoresists to achieve high performance imaging with photoresist materials that are soluble in new casting solvents. There are a limited number of photoresist materials available. Third, if the second photoresist layer is alcohol soluble, this negates the use of an alcohol soluble immersion top coat material and high resolution imaging is not possible with standard immersion lithography techniques.

A fourth scheme know in the art utilizes spun-cast layers from two immiscible solvent systems as shown in FIG. 6. Here we limit it to the case of a two layer dual damascene structure. Most often an alcohol soluble resist is cast on the top of a first resist. Each resist receives a post-application bake. We refer to this as post apply processing typically comprising baking the film after application at temperatures generally in the range of 150 C-250 C to elicit a solubility switching reaction or a crosslinking reaction.

The multilayer stack is then subject to either two binary exposures or a single ternary exposure to generate an aerial image that mimics the dual damascene structure once the exposure resist is developed. The challenge here is that the depth of focus is not sufficient for low-k1 imaging. Additionally, the irradiation is integrated by the resist whether it is a single or double exposure. Therefore the developed images of the first and second resist are coupled.

SUMMARY OF THE INVENTION

An ideal method for enabling double exposure is a scheme in which conventional photoresists can be utilized, and the second imaging layer does not require printing over topography or with significant depth of focus, and exposure dose of each film is nominally independent of the other. The present invention addresses these issues by a process that uses an etch selective, planarizing overcoat material that also serves as a protective layer for the underlying photoresist and also provides a product as well as a product produced by such process or processes that address these needs, and not only provides advantages over the related art, but also substantially obviates one or more of the foregoing and other limitations and disadvantages of the related art.

The written description, abstract of the disclosure, claims, and drawings of the invention as originally set out herein, or as subsequently amended, set forth the features and advantages and objects of the invention, and point out how they may be realized and obtained. Additional objects and advantages of the invention may be learned by practice of the invention.

To achieve these and other advantages and objectives, and in accordance with the purpose of the invention as embodied and described herein, the invention comprises a process for enabling cost effective, high throughput methodology for reducing lithographic resolution with double exposure for the manufacture of a semiconductor device and a semiconductor device that incorporates these features, including semiconductor device products made by such process. The written description, abstract of the disclosure, claims, and drawings of the invention as originally set out herein, or as subsequently amended, set forth the features and advantages and objects of the invention, and point out how they may be realized and obtained. Additional objects and advantages of the invention may be learned by practice of the invention.

The present invention relates to the fields of deep ultraviolet photolithography, next generation lithography, and semiconductor fabrication. More specifically, a spin-castable methodology for enabling multiple patterning is disclosed wherein a standard lithography process is completed for the first exposure, followed by the spin casting of an etch selective overcoat layer, followed by a second photoresist and subsequent lithography. By utilizing the etch selectivity of each layer, a cost-effective, high resolution patterning technique is achieved. The invention relates to a number of double or multiple patterning techniques, some aimed at achieving resolution benefits, as well as others that achieve cost savings, or both resolution and cost savings. These techniques include, but are not limited to, pitch splitting techniques, pattern decomposition techniques, and dual damascene structures.

BRIEF DESCRIPTION OF THE DRAWINGS

The features of the invention believed to be novel and the elements and characteristic of the invention are set forth with particularity in the written description and claims. The accompanying drawings, incorporated in and which constitute a part of this specification, illustrate single and multiple embodiments of the invention, and together with the other parts of the specification, serve to explain the objects, advantages and principles of the invention. The drawings present figures that are not necessarily drawn to scale. The invention itself, both as to organization method of operation, and structure may be understood by reference to the written description that follows taken in conjunction with the accompanying drawings in which:

FIG. 3 which, includes FIG. 3(a) to FIG. 3(d) comprising side elevations in cross section, illustrates a process for manufacturing a semiconductor device and shows one embodiment of the present invention.

FIG. 7 which includes FIG. 7(a) to FIG. 7(e) and FIG. 7(ap), FIG. 7(bp), FIG. 7(cp), FIG. 7(dp), FIG. 7(ep), comprising side elevations in cross section and plan views shows one embodiment of the present invention to create high resolution contact holes in a semiconductor device.

FIG. 8 includes FIG. 8(ap) to FIG. 8(ep) and FIG. 8 (a) and FIG. 8 (b), side elevations in cross section and plan views, in one embodiment of the invention illustrating the creation of high resolution lines in a semiconductor device, and then "cutting" those lines by means of a subsequent exposure.

FIG. 12 includes FIG. 12(a) to FIG. 12(f), side elevations in cross-section in one embodiment of the invention illustrating a process for the manufacture of a semiconductor device wherein the first pattern is exposed in a silicon containing photoresist.

FIG. 14 includes FIG. 14(a) to FIG. 14(k), side elevations in cross-section and plan views in one embodiment of the invention, in which the first pattern the superior resolution in printing small lines in a positive tone resist is exploited to produce a dual damascene structure.

DETAILED DESCRIPTION OF THE INVENTION

Figure 1A:
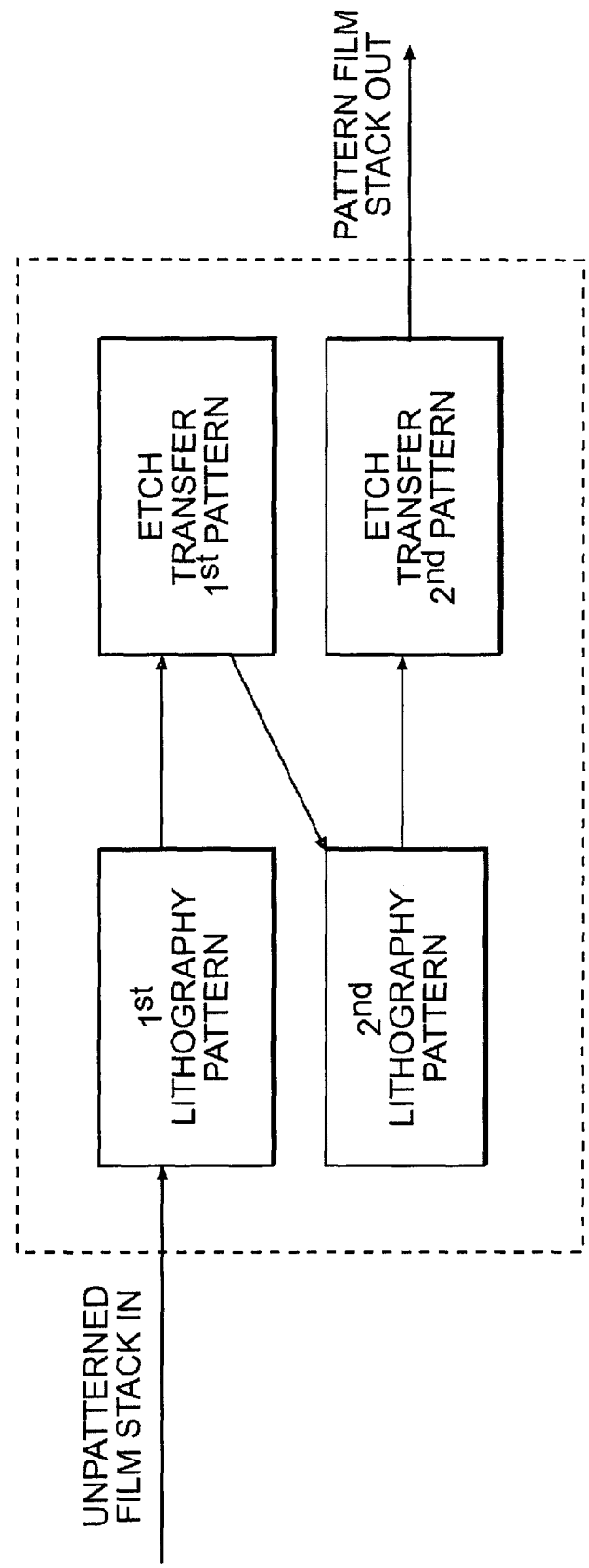
FIG. 1 which includes FIG. 1(a) and FIG. 1(b) shows a generalized process flow chart or double exposure technique for manufacturing a semiconductor device.
Figure 1B:
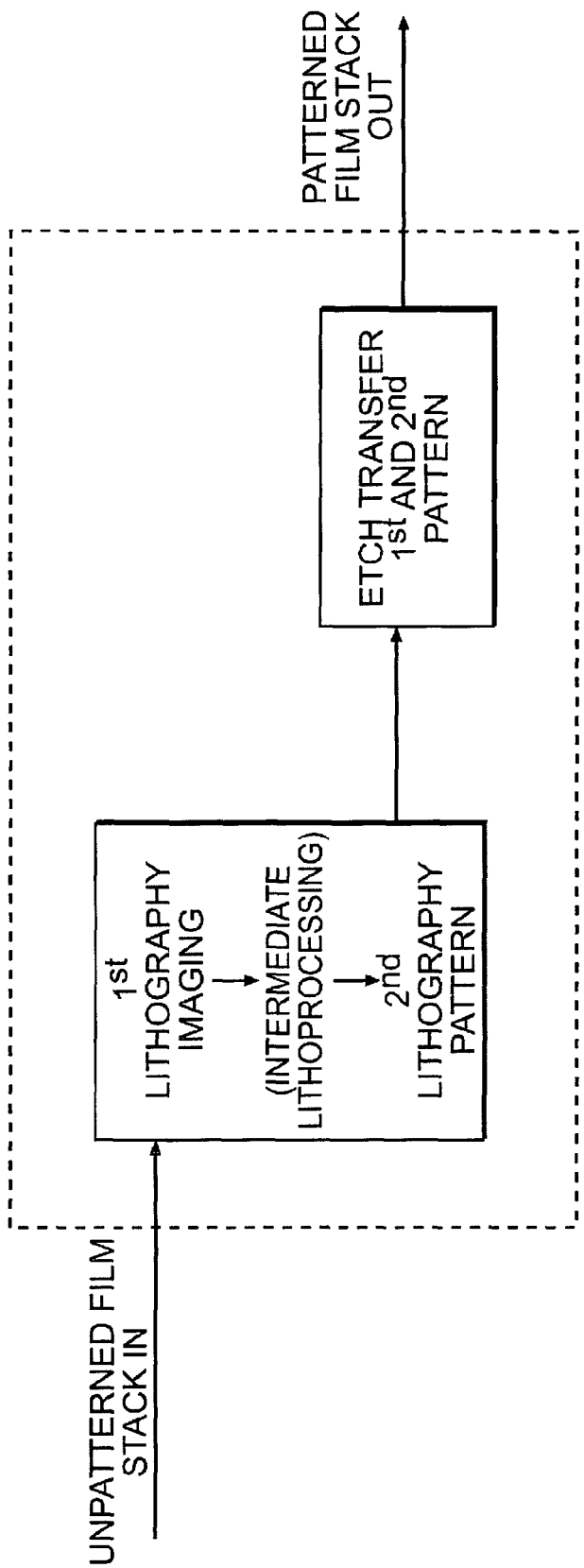
Figure 2A:
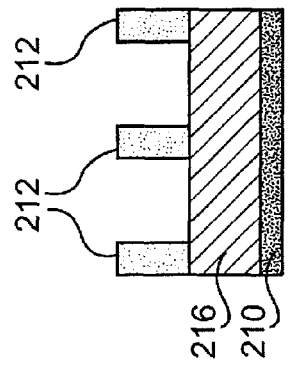
FIG. 2 which, includes FIG. 2(a) to FIG. 2(f) comprising side elevations in cross section, illustrates a process for manufacturing a semiconductor device and shows one embodiment of the present invention.
Figure 2B:
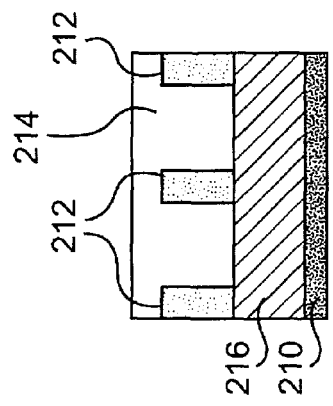
Figure 2C:
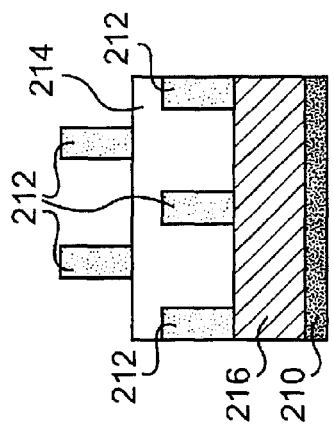
Figure 2D:
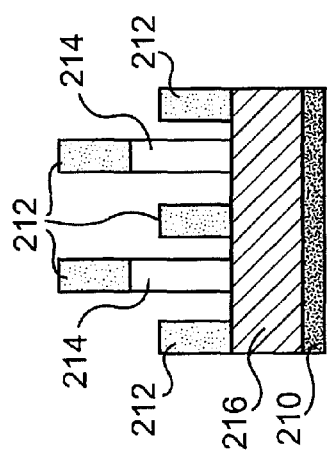
Figure 2E:
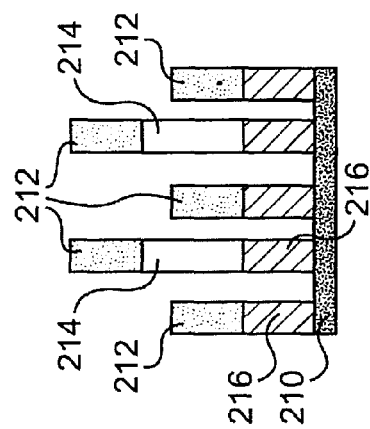
Figure 2F:
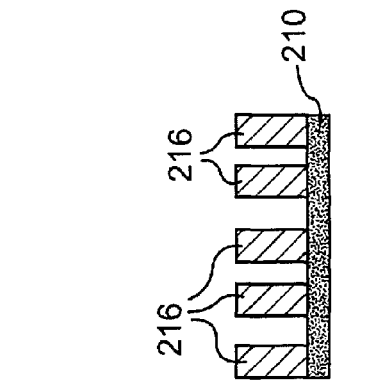
Figure 4B:
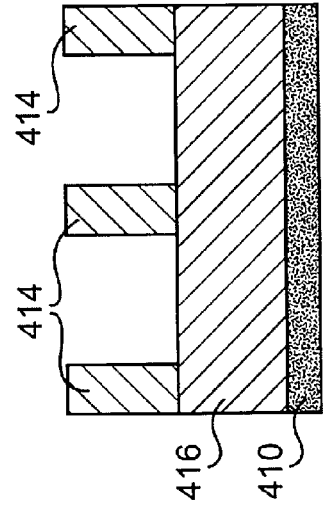
FIG. 4 which, includes FIG. 4(a) to FIG. 4(d) comprising side elevations in cross section, illustrates one example of a prior art process for manufacturing a semiconductor device.
Figure 4D:
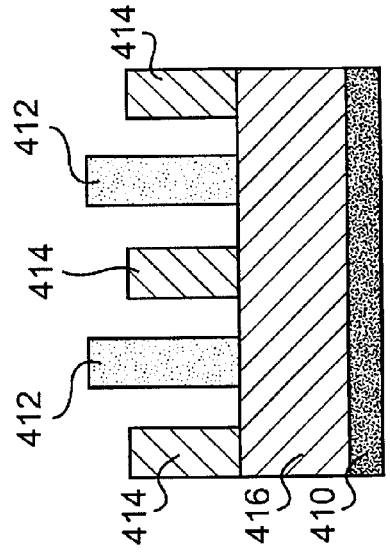
Figure 4A:
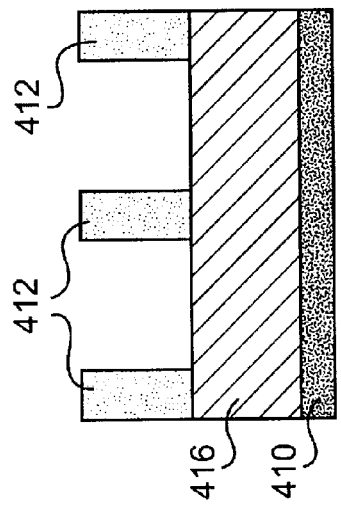
Figure 4C:
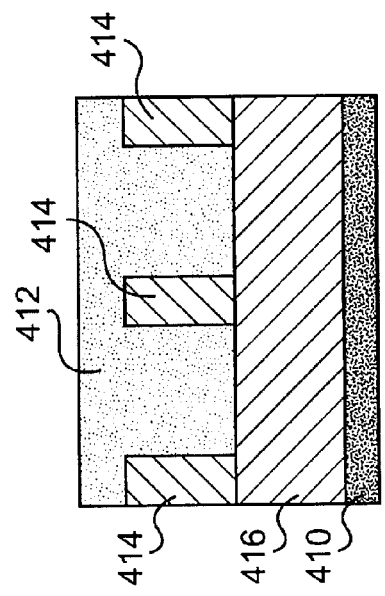

FIG. 1(a) illustrates typical double patterning techniques employing a lithography step, an etch step, a second lithography step and a second etch step and FIG. 1(b) illustrates lower cost double patterning techniques employing two lithography steps but only a single etch step.

FIG. 2 illustrates the use of a substrate 210, organic photoresist 212, etch selective overcoat 214 and patterning layer 216 in one aspect of the invention. FIG. 2(a) illustrates a first step comprising standard lithographic imaging, followed by FIG. 2(b) which illustrates overcoating with etch selective overcoat 214 of an etch selective polymer coating 214, followed by (c) a second photoresist coating 212 and standard lithographic imaging, followed by (d) etch transfer of the second image into the etch selective layer, followed by (e) etch transfer of the first and second composite images into the patterning film or layer 216 of interest, followed by (f) removal of remaining photoresist 212 and etch selective overcoat material 214.

FIG. 3 illustrates the use of a substrate 310, organic photoresist 312, etch isolation layer 314 and patterning layer 316 in one aspect of the invention. FIG. 3(a)illustrates standard lithographic imaging, followed by FIG. 3(b) illustrating application of a polymer "isolation layer," 314 followed by FIG. 3(c) a second photoresist coating 312 and standard lithographic imaging illustrated by FIG. 3(d)

FIG. 4 illustrates the use of a substrate 410, organic photoresist 412, hardened photoresist 414 and patterning layer 416 in one aspect of the invention. FIG. 4(a) illustrates standard lithographic imaging, followed by FIG. 4(b) "hardening" or curing of the photoresist that renders the patterned hardened photoresist 414 insoluble to a subsequent photoresist casting solvent, followed by FIG. 4(c) a second photoresist coating 412 and standard lithographic imaging illustrated by FIG. 4(d).

Figure 5A:
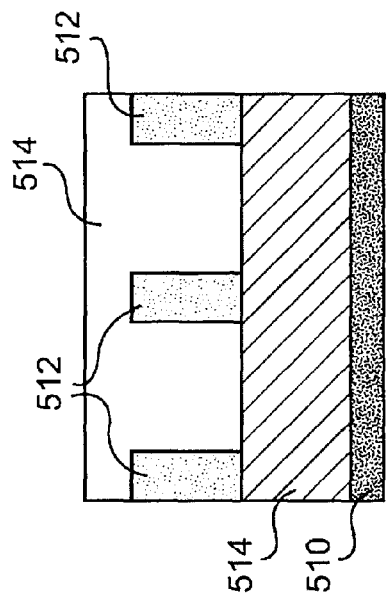
FIG. 5 which includes FIG. 5(a) to FIG. 5(c) comprising side elevations in cross section shows an example of a prior art method for manufacturing a semiconductor device.
Figure 5B:
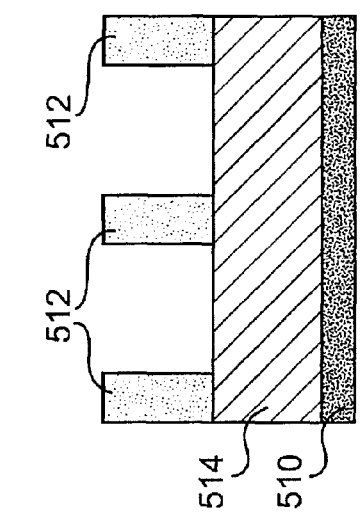
Figure 5C:
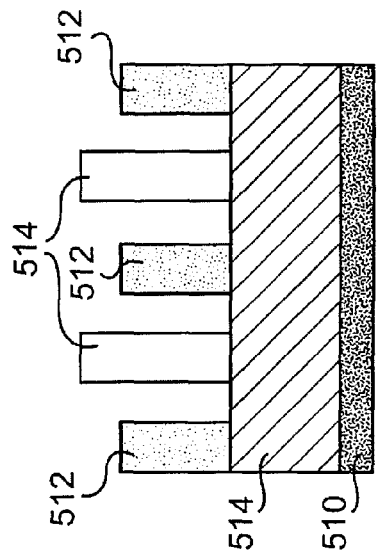

FIG. 5 illustrates the use of a substrate 510, organic photoresist 512, photoresist 514 cast from a different solvent than organic photoresist 512 and patterning layer 516 in one aspect of the invention. FIG. 5(a) illustrates standard lithographic imaging, followed by FIG. 5(b) illustrating casting of a new photoresist material 514 from an alcohol solvent, followed by FIG. 5(c) showing exposure and standard lithographic patterning of the second photoresist material 514.

Figure 6:
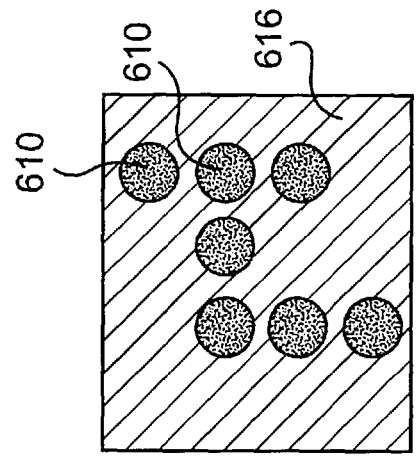
FIG. 6 which includes FIG. 6(a) to FIG. 6(e) and FIG. 6(ap), FIG. 6(cp), FIG. 6(ep), comprising side elevations in cross section and plan views shows one embodiment of the present invention to create high resolution, random patterns of contact holes in a semiconductor device.
Figure 6:
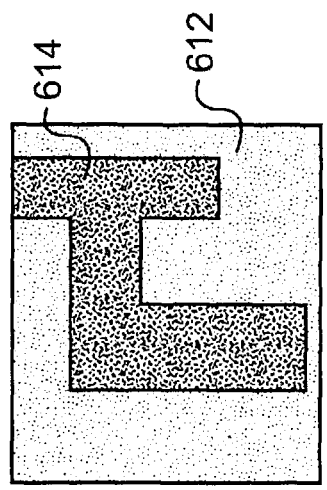
Figure 6:
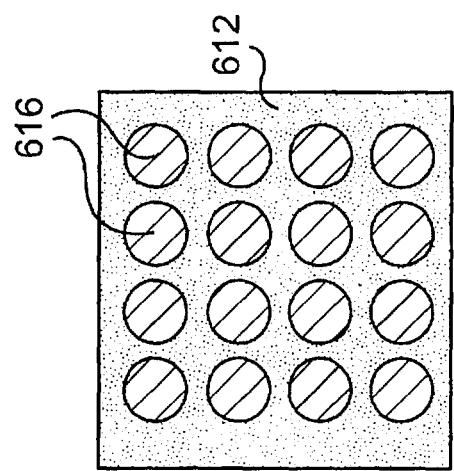
Figure 9A:
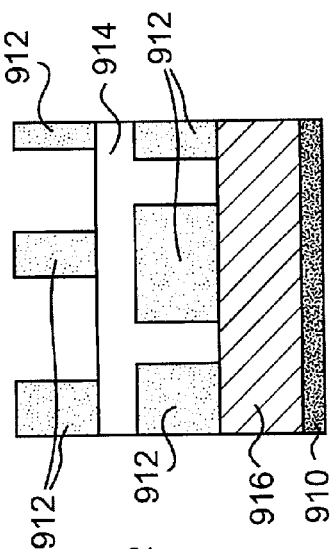
FIG. 9 includes FIG. 9(a) to FIG. 9(f), side elevations in cross-section, in one embodiment of the invention illustrating the creation of dual damascene structures in a semiconductor device.
Figure 9B:
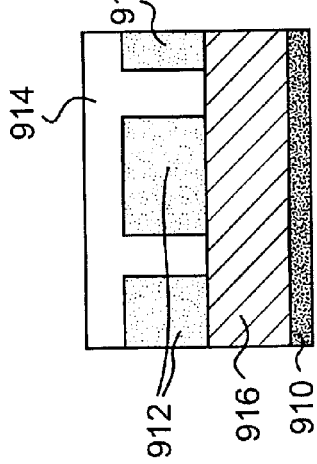
Figure 9C:
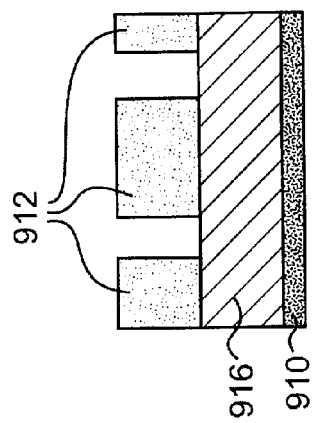
Figure 9D:
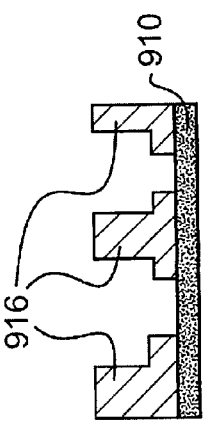
Figure 9E:
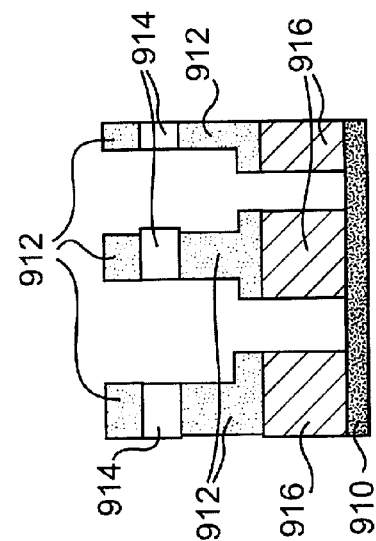
Figure 9F:
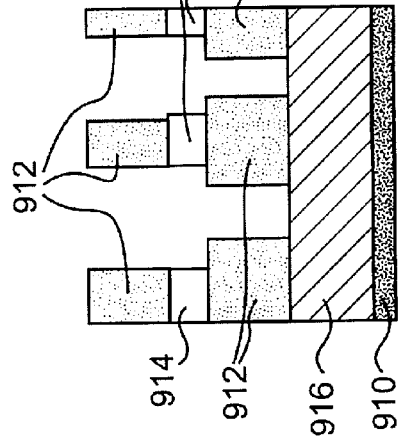
Figure 10C:
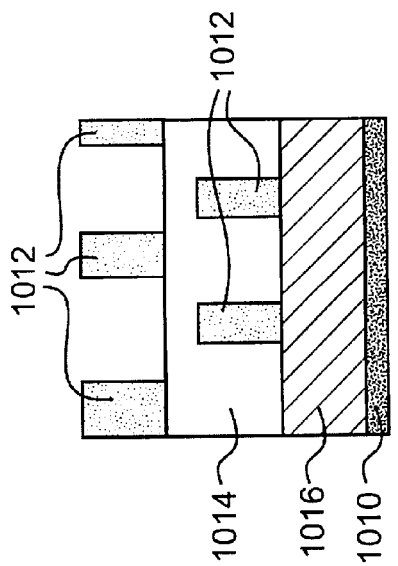
FIG. 10 includes FIG. 10(a) to FIG. 10(f), side elevations in cross-section in one embodiment of the invention illustrating the creation of dual damascene structures in a semiconductor device.
Figure 10B:
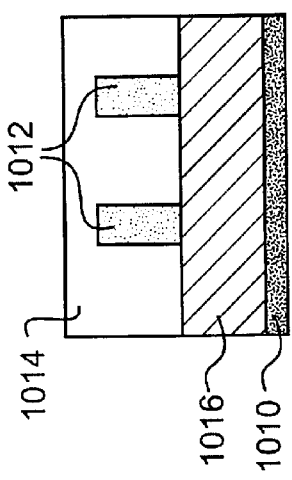
Figure 10A:
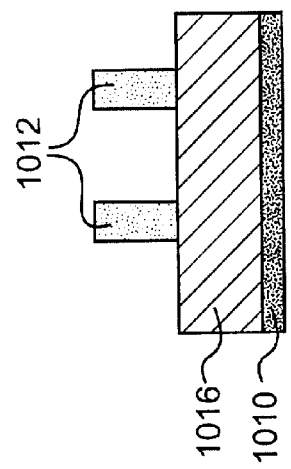
Figure 10F:
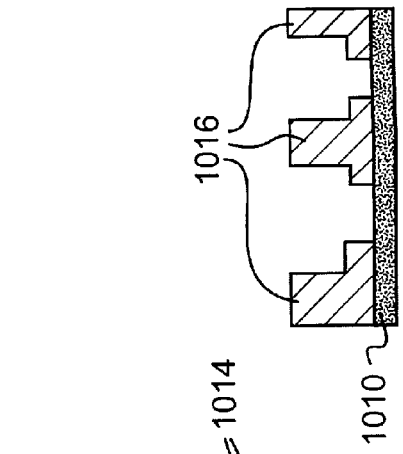
Figure 10E:
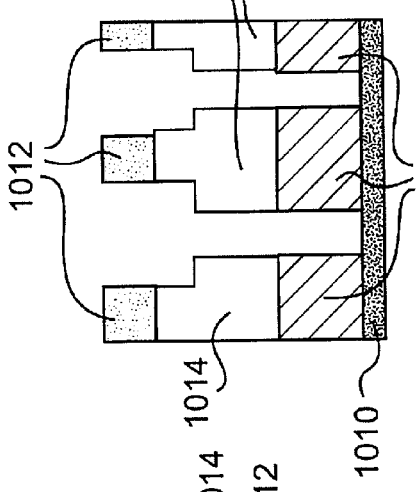
Figure 10D:
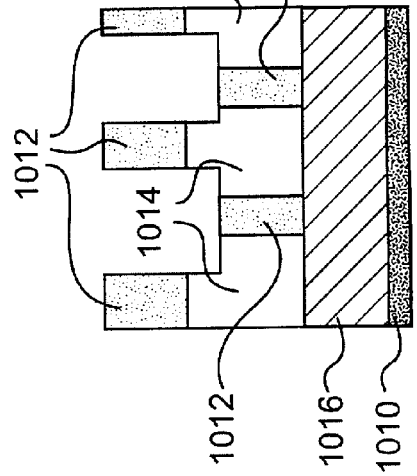
Figure 11A:
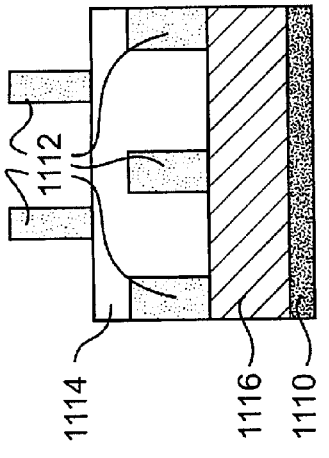
FIG. 11 includes FIG. 11(a) to FIG. 11(f), side elevations in cross-section, in one embodiment of the invention illustrating the manufacture of a semiconductor device in which the first pattern is exposed in a silicon containing photoresist.
Figure 11B:
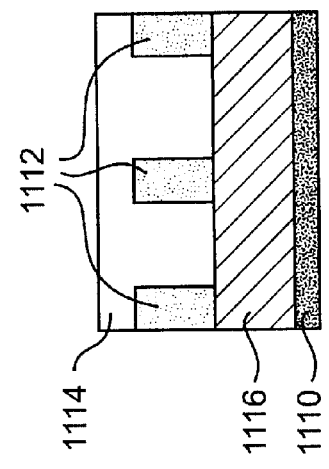
Figure 11C:
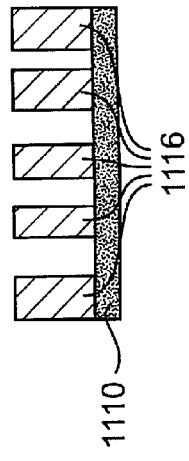
Figure 11D:
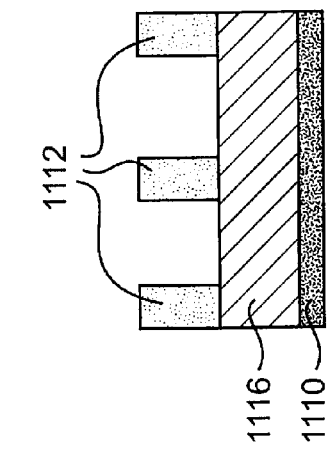
Figure 11E:
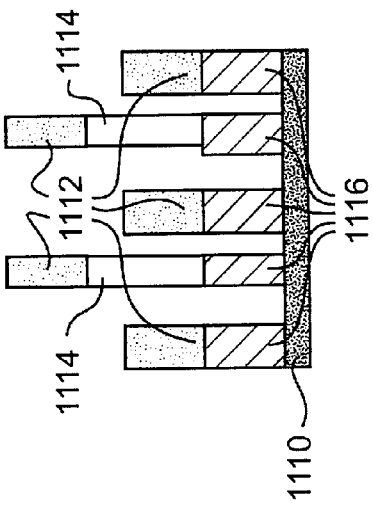
Figure 11F:
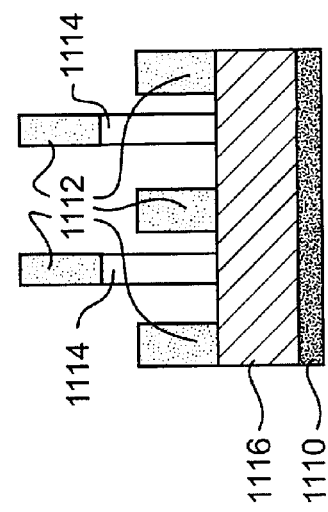

FIG. 6 illustrates the use of a substrate 610, organic photoresist 612, etch selective overcoat 614 and patterning layer 616 in one aspect of the invention. The first step illustrated by FIG. 6(a) comprises standard lithographic imaging of a dense array of contact holes, followed by the step illustrated by FIG. 6(b) comprising overcoating with an etch selective polymer coating 612, followed by the step illustrated by FIG. 6(c) comprising a second photoresist coating and standard lithographic imaging. The standard lithographic imaging comprises employing transparent layer 618 in combination with layers 620 or 624 having mask openings to allow exposure radiation to impact on organic photoresist 612. We follow this by the step illustrated by FIG. 6(d) comprising etch transfer of the second image of FIG. 6(c) into the etch selective layer 614, followed by the steps comprising etch transfer of the first and second composite images of FIGS. 6(a) and 6(c) into the patterning film or layer 616 of interest and, removal of remaining photoresist and etch selective overcoat materials 612 and 614, resulting in the structure illustrated in FIG. 6(e). FIG. 6(ap), FIG. 6(cp), and FIG. (6ep) comprise plan views respectively of FIG. 6(a), FIG. 6(c), and FIG. 6e).

FIG. 7 illustrates the use of a substrate 710, organic photoresist 712, etch selective overcoat 714 and patterning layer 716 in one aspect of the invention. The first step illustrated by FIG. 7(a) comprises standard lithographic imaging of a dense array of contact holes, followed by the step illustrated by FIG. 7(b) comprising overcoating with an etch selective polymer coating 714, followed by the step illustrated by FIG. 7(c) comprising a second photoresist coating 712 and standard lithographic imaging, followed by the step illustrated by FIG. 7(d) comprising etch transfer of the second image into the etch selective layer 714, followed by the step illustrated by FIG. 7(e) comprising etch transfer of the first and second composite images of FIGS. 7(c) and 7(d) into the patterning film of interest and removal of remaining photoresist 714 and etch selective overcoat material 714. FIG. 7(ap), FIG. 7(bp), FIG. 7(cp), FIG. 7(dp), and FIG. (7ep) comprise plan views respectively of FIG. 7(a), FIG. 7(b), 7(c), FIG. 7(d), and FIG. (7e).

FIG. 8 illustrates the use of a substrate 810, organic photoresist 812, etch selective overcoat 814 and patterning layer 816 in one aspect of the invention. FIG. 8(ap) to FIG. 8(ep) comprise plan views wherein the first step illustrated by FIG. 8(ap) comprises standard lithographic imaging of spaces in a photoresist coating 812, followed by the step illustrated by FIG. 8(bp) comprising overcoating with an etch selective polymer coating 814, followed by the step illustrated by FIG. 8(cp) comprising a second photoresist coating 812 and standard lithographic imaging, followed by the step illustrated by FIG. 8(dp) comprising etch transfer of the second image into the etch selective layer 814, followed by the step illustrated by FIG. 8(ep) comprising etch transfer of the first and second composite images into the patterning film of interest and removal of remaining photoresist 812 and etch selective layer or overcoat material 814. FIG. 8(a) and FIG. 8(b) illustrate side elevations in cross section of FIG. 8(ap) and FIG. 8(bp) respectively.

FIG. 9 illustrates the use of a substrate 910, organic photoresist 912, etch selective overcoat 914 and patterning layer 916 in one aspect of the invention. FIG. 9 includes FIG. 9(a) to FIG. 9(f), side elevations in cross-section, in one embodiment of the invention illustrating the creation of dual damascene structures in a semiconductor device in which the first step illustrated by FIG. 9(a) is the standard lithographic patterning of via structures in a photoresist in a positive tone manner, followed by the step illustrated in FIG. 9(b) comprising overcoating with an etch selective polymer coating 914, followed by the step illustrated in FIG. 9(c), comprising a second photoresist 912 coating and imaging of the "metal" or "line" level, followed by the step illustrated in FIG. 9(d), comprising etch transfer of the first image through the etch selective overcoat material 914. The next step, illustrated sequentially in FIG. 9(e) and FIG. 9(f) is the etch transfer of the composite pattern into the underlying dielectric film or substrate 910, along with removal of remaining photoresist and/or etch selective overcoat 912 and 914 respectively.

FIG. 10 illustrates the use of a substrate 1010, organic photoresist 1012, etch selective overcoat 1014 and patterning layer 1016 in one aspect of the invention. FIG. 10 includes FIG. 10(a) to FIG. 10(f), side elevations in cross-section in one embodiment of the invention illustrating the creation of dual damascene structures in a semiconductor device. The first step, illustrated in FIG. 10(a) is the patterning of vias into a photoresist 1012 on a patterning layer 1016 in an inverted manner (such as with the use of a negative tone resist, although other techniques can be employed). The next step is illustrated in FIG. 10(b) comprising overcoating with an etch selective polymer coating 1014, followed by the step illustrated in FIG. 10(c), comprising a second photoresist coating 1012 and imaging of the "metal" or "line" level, followed by the step illustrated in FIG. 10(d), comprising etch transfer of the first image through the etch selective overcoat material 1014. The next step, illustrated sequentially in FIG. 10(e) and FIG. 10(f) is the etch transfer of the composite pattern into the underlying substrate1010 (dielectric film 1010), along with removal of remaining photoresist 1012 and/or etch selective overcoat 1014.

FIG. 11 illustrates the use of a substrate 1110, bi-layer photoresist 1112, etch selective overcoat 1114 and patterning layer 1116 in one aspect of the invention. FIG. 11 includes FIG. 11(a) to FIG. 11(f), side elevations in cross-section, in one embodiment of the invention illustrating the manufacture of a semiconductor device in which the first step, illustrated in FIG. 11(a) is patterning of a silicon containing photoresist 1112. The first pattern is then overcoated with an organic, etch selective overcoat 1114, as illustrated in FIG. 11(b). The next step, illustrated in FIG. 11(c), is the patterning of a second silicon containing photoresist 1112. Subsequently, as illustrated in FIG. 11(d), the composite image is transferred through the organic overcoat 1114, using the first and second patterns of FIGS. 11(b) and 11(c) as an etch mask. The next step, illustrated in FIG. 11(e) is the transfer of the composite pattern into an underlying film 1110. Finally, as illustrated in FIG. 11(f), the photoresist 1112 and etch selective overcoat 1114 materials are removed from the final pattern.

FIG. 12 illustrates the use of a substrate 1210, bi-layer photoresist containing silicon 1212, etch selective organic overcoat 1214, silicon containing BARC 1216, organic photoresist 1218 and patterning layer 1220 in one aspect of the invention. FIG. 12 includes FIG. 12(a) to FIG. 12(f), side elevations in cross-section in one embodiment of the invention illustrating a process for the manufacture of a semiconductor device wherein the first pattern, illustrated in FIG. 12(a) is exposed in a silicon containing photoresist 1212. As illustrated in FIG. 12(b), the first pattern is then overcoated with an organic, etch selective overcoat 1214. The next step, illustrated in FIG. 12(c), is to overcoat the organic, etch selective overcoat 1214 with an inorganic material 1216, often referred to as a "silicon containing BARC." The BARC 1216 may contain silicon, or another etch selective moiety. As illustrated in FIGS. 12(c) and 12(d), a second photoresist is patterned with an organic photoresist 1218, and, as illustrated in FIG. 12(e), the composite image is transferred through the organic and inorganic overcoat, using the first and second patterns of FIGS. 12(c) and 12(d) as an etch mask. Finally, as illustrated in FIG. 12(f), the photoresists 1212 and 1218, and etch selective overcoats 1214 are removed from the final pattern.

Figure 13A:
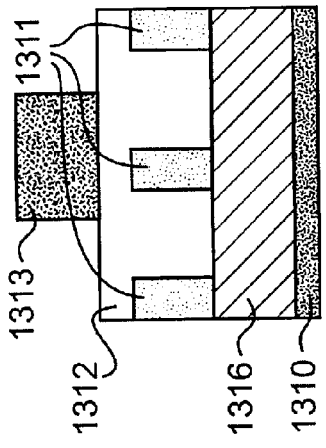
FIG. 13 includes FIG. 13(a) to FIG. 13(l), side elevations in cross-section and plan views in one embodiment of the invention, illustrating a process for the manufacture of a semiconductor device in which we exploit the superior resolution in printing small lines in a positive tone resist in the first pattern to produce a via structure.
Figure 13B:
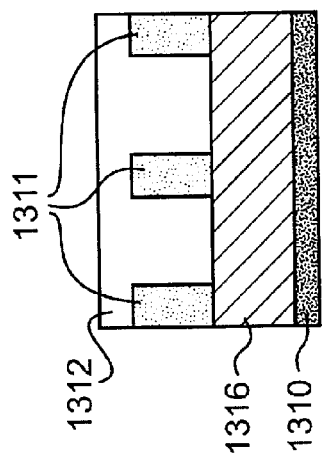
Figure 13C:
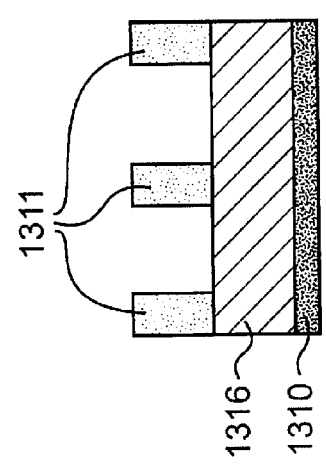
Figure 13D:
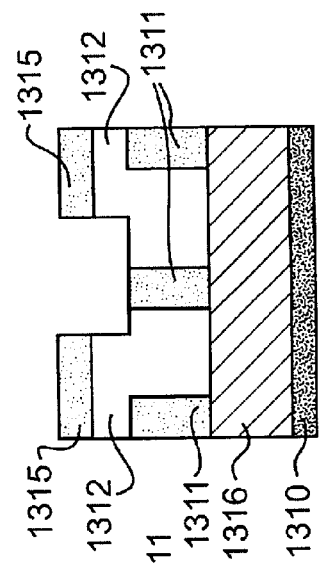
Figure 13E:
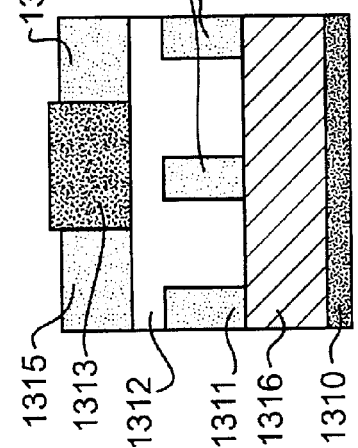
Figure 13F:
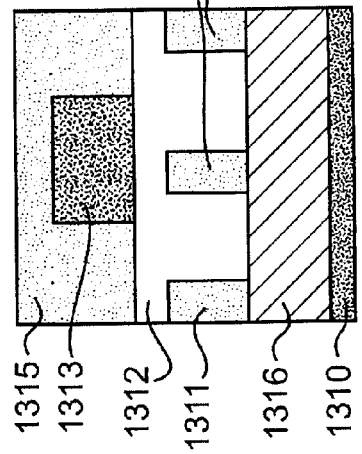

FIG. 13 illustrates the use of a substrate 1310, a photoresist 1311, an etch-selective overcoat (inorganic), etch selective organic photoresist 1314, a patterning layer 1316, a region transferred into the patterning layer 1318, a CP mask 1320 for the device shown in FIG. 13(a), and another CP mask 1322 for the device shown in FIG. 13(a) in one aspect of the invention. FIG. 13 includes FIG. 13(a) to FIG. 13(i), side elevations in cross-section of a device according to an aspect of the invention; FIG. 13(j), and FIG. 13(k), show plan views of masks used according to one aspect of the invention, and in another embodiment of the invention, FIG. 13(l) shows a plan view of the composite image of both masks shown in FIG. 13(j) and FIG. 13(k). FIG. 13 in one aspect of the invention, illustrates a process for the manufacture of a semiconductor device in which we exploit the superior resolution in printing small lines in a positive tone resist in the first pattern to produce a via structure. As illustrated in FIG. 13(a), the first resist is printed with a typical line/space grating pattern. As illustrated in FIG. 13(b), an etch selective overcoat 1312 is then applied. As illustrated in FIG. 13(c), a second photoresist line (or lines) 1313 is printed orthogonal to the first set of line(s) and, as illustrated by FIG. 13(d), also overcoated by a selective etch resistant material 1315. As illustrated in FIG. 13(e), the topmost etch selective overcoat 1315 is etched to the surface of the second resist 1313. Then, as illustrated in FIG. 13(f), the second resist 1313 is stripped revealing a trough of superior resolution than can be generated by printing a trough in a positive tone resist. As illustrated in FIG. 13(g), the stack is then etched to reveal the topmost surface of the first printed resist 1311 that has been encapsulated in the first etch selective layer 1312. As illustrated in FIG. 13(h), the composite image is then etch transferred through the first photoresist layer. As illustrated in FIG. 13(i), remaining photoresist and etch selective overcoat materials are removed. Only the topdown "projected" intersection of the resists is transferred into the substrate. FIG. 13(j) illustrates a topdown (plan view) of the chrome positive (CP) mask required to print the image shown in FIG. 13(a). FIG. 13(k) shows an example of the CP mask required to print the resist image shown in FIG. 13(c). FIG. 13(l) shows the plan view of the composite image of both masks shown in FIG. 13(j) and FIG. 13(k).

FIG. 13 illustrates the use of a substrate 1310, a photoresist 1311, an etch-selective overcoat (inorganic), etch selective organic photoresist 1314, a patterning layer 1316, a region transferred into the patterning layer 1318, a CP mask 1320 for the device shown in FIG. 13(a), and another CP mask 1322 for the device shown in FIG. 13(a) in one aspect of the invention. FIG. 14 includes FIG. 14(a) to FIG. 14(i), side elevations in cross-section in one embodiment of the invention, in which the first pattern the superior resolution in printing small lines in a positive tone resist is exploited to produce a dual damascene structure. As illustrated in FIG. 14(a), The first resist is printed with a typical line/space grating pattern. As illustrated in FIG. 14(b), an etch selective overcoat is then applied. As illustrated in FIG. 14(c), a second photoresist line or lines is printed orthogonal to the first set of line(s) and, as illustrated by FIG. 14(d), also overcoated by a second selective etch resistant material. As illustrated in FIG. 14(e), the topmost etch selective overcoat is etched to the surface of the second resist. Then, as illustrated in FIG. 14(f), the second resist is stripped revealing a trough of superior resolution than can be generated by printing a trough in a positive tone resist. As illustrated in FIG. 14(g), the stack is then etched to reveal the topmost surface of the first printed resist that has been encapsulated in the first etch selective layer. As illustrated in FIG. 14(h), the composite image is then etch transferred through the first photoresist layer. As illustrated in FIG. 14(i), the composite image is continually etch transferred into the underlying patterning film, and remaining photoresist and etch selective overcoat materials are removed. In this embodiment, only the topdown "projected" intersection of the first resist, along with the entire second pattern, are transferred into the substrate. FIG. 14(j) illustrates a topdown (plan view) of the chrome positive (CP) mask required to print the image shown in FIG. 14(a). FIG. 14(k) shows and example of the CP mask required to print the resist image shown in FIG. 14(c). FIG. 14(l) shows the plan view of the composite image of both masks shown in FIG. 14(j) and FIG. 14(k).

Thus the invention comprises a method for enabling a cost effective, high throughput methodology for reducing lithographic resolution with double exposure techniques. A further aspect comprises providing a process for applications that require two imaging layers, but can be cost effective if both imaging layers are patterned prior to leaving a Lithography Process Module. FIG. 2 provides a summary of the general imaging scheme. The present invention comprises the use of a single-layer spin-on etch selective overcoating, having strategically designed etching and solubility properties to afford a second photoresist image in direct proximity to the first photoresist image. The invention comprises the method of formation of these structures, several structural embodiments, as well as the composition of matter required to achieve an etch selective overcoating with appropriate properties.

The invention further encompasses material compositions for the etch selective overcoat layer that provide ideal etch, optical, mechanical, planarization and solubility properties, while being applicable using standard spin on application techniques. The coating compositions are characterized by the presence of one or more polymer components. These polymer components are further characterized by having chromophore moieties and transparent moieties.

In one aspect, the invention encompasses a composition suitable for formation of a spin-on etch selective overcoat, the composition comprising: (a) one or more polymers having chromophore moieties and/or transparent moieties, (b) a suitable casting solvent, optionally, (c) a crosslinking component, and optionally (d) an acid generator, and optionally (e) a surfactant.

The polymer components are preferably random copolymers selected from the group containing siloxane, silsesquioxanes, and carbosilane moieties. These moieties are preferably functionalized in order to tune the required physical properties of the polymer (optical constants, surface energy). The polymer components also preferably contain a plurality of reactive sites distributed along the polymer for reaction with the crosslinking component. The polymer component is preferably 13-45 wt % silicon in order to obtain appropriate etch selectivity to the conventional organic photoresists. Examples of types of silicone polymers suitable for this application can be found in (D. Abdallah et al. "Spin on trilayer approaches to high NA 193 nm lithography" Proc SPIE 2007, FIG. 10). For example, polyhedral silsequioxanes (POSS), and silsequioxanes with organic crosslinking functionalities. Furthermore, suitable polymers are listed in prior art such as US Patent Application Number 2003/0198877; and U.S. Pat. Nos. 7,187,081; 7,172,849; and 7,141,692.

The etch selective overcoat compositions of the present disclosure will typically contain a solvent prior to their application to the desired substrate. The solvent may be any solvent conventionally used with resists which otherwise does not have any excessively adverse impact on the performance of the etch selective overcoat. Examples of solvents are propylene glycol monomethyl ether acetate, cyclohexanone, and ethyl lactate. However, in order to be compatible with a wide range of commercial photoresists, an alcohol based casting solvent may be preferred. Examples of such casting solvents are 1-butanol, 2-butanol, 1-pentanol, 4-methyl-2-pentanol, 2-pentanol, 3-methyl-1-butanol and the like. The amount of solvent in the composition for application to a substrate is typically sufficient to achieve a solids content of about 2-20 wt. %. Higher solids content formulations will generally yield thicker coating layers. The compositions of the present disclosure may further contain minor amounts of auxiliary components (e.g., base additives, etc.) as may be known in the art.

The (optional) acid generator is preferably a thermally activated acid generator. The acid generator is typically a thermal acid generator compound that liberates acid upon thermal treatment. A variety of known thermal acid generators are suitably employed such as e.g. 2,4,4,6-tetrabromocyclohexadienone, benzoin tosylate, 2-nitrophenyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236. If desired, a radiation-sensitive acid generator may be employed as an alternative to a thermally activated acid generator or in combination with a thermally activated acid generator. Examples of suitable radiation-sensitive acid generators are described in U.S. Pat. No. 5,939,236. Other radiation-sensitive acid generators known in the photoresist art may also be used as long as they are compatible with the other components of the etch selective overcoat. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process for high throughput. Mixtures of acid generators may be used.

In one aspect, the invention encompasses a composition suitable for formation of a spin-on etch selective overcoat, the composition comprising: (a) one or more polymers having chromophore moieties and/or transparent moieties, and optionally, (b) a crosslinking component, and optionally (c) an acid generator.

The polymer components are preferably random copolymers selected from the group containing siloxane, silsesquioxanes, and carbosilane moieties. These moieties are preferably functionalized in order to tune the required physical properties of the polymer (optical constants, surface energy). The polymer components also preferably contain a plurality of reactive sites distributed along the polymer for reaction with the crosslinking component. The polymer component is preferably 13-45 wt % silicon in order to obtain appropriate etch selectivity to the conventional organic photoresists.

The acid generator is preferably a thermally activated acid generator. The acid generator is typically a thermal acid generator compound that liberates acid upon thermal treatment. A variety of known thermal acid generators are suitably employed such as e.g. 2,4,4,6-tetrabromocyclohexadienone, benzoin tosylate, 2-nitrophenyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the photoresist art may also be used as long as they are compatible with the other components of the etch selective overcoat. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process for high throughput. Mixtures of acid generators may be used.

In another aspect, the invention is directed to a method of forming a patterned material layer on a substrate, the method comprising: providing a substrate having a material layer on a surface thereof; optionally forming an antireflective coating layer of the invention over the material layer, depositing a photoresist composition on the substrate to form a photoresist imaging layer on the material; optionally applying a topcoat layer; pattern wise exposing the imaging layer to radiation thereby creating a pattern of radiation-exposed regions in the imaging layer, selectively removing portions of the imaging layer by standard post exposure processing, spin applying an etch selective overcoat and a subsequent photoresist imaging layer on the material; optionally applying a topcoat layer; pattern wise exposing the imaging layer to radiation thereby creating a pattern in the imaging layer, selectively removing portions of the imaging layer by standard post exposure processing, and finally etching and removing the exposed portions of both material layers, thereby forming the patterned material feature as the composite structure of two (or more) independent lithographic exposures.

The material to be patterned is preferably a conductive, semiconductive, magnetic or insulative material, or a metal. These and other aspects of the invention are discussed in further detail below.

Thus, we describe various embodiments of implementing a multiple exposure lithography method that incorporates intermediate layer coating. Briefly stated, a first structure comprising a set of patterned features is defined in an organic photoresist material through a first exposure. Then a partially inorganic material is coated on top of the patterned substrate. The inorganic material may be, for example, a silicon containing intermediate layer. Thereafter, at least one other set of patterned features is created through at least a second exposure with an organic photoresist so as to result in a composite set of patterned features, which are then transferred through the entire stack and then directly upon a semiconductor substrate to be patterned.

As used herein, the term "substrate" may refer to any level of semiconductor device (e.g., active area, dielectric/insulating layer, etc.) subject to further processing and feature patterning. An "organic underlayer" is a material that is spin coated onto a substrate, the underlayer having an exemplary thickness of about 100 nanometers (nm) to about 1000 nm, with index of refraction (n) and absorption constant (k) values optimized to minimize reflectivity. The reflectivity may either be minimized with the organic underlayer, or together with an inorganic intermediate layer in the case of a tri-layer resist system. An organic underlayer includes elements such as C, H, O and N, and is cross-linkable so that it does not intermix with subsequently spin coated materials. In addition, the organic underlayer is designed to have selectivity relative to inorganic materials such as silicon-containing resist or inorganic intermediate layers (as well as having good etch selectivity relative to the substrate).

An "inorganic intermediate layer" generally refers to a material that is spin coated on top of an organic underlayer in a tri-layer resist scheme. In this case, it may also refer to the material used as the intermediate coating over the first structure comprising a set of photoresist structures (or multiple sets for the case of multiple patterning). In exemplary embodiments presented herein, the inorganic intermediate layer is silicon-containing, and cross-linkable so that it does not intermix with subsequently spin coated materials. The inorganic layer is designed to have good etch selectivity relative to the organic underlayer. Exemplary thicknesses of about 25 nanometers (nm) to about 400 nm are used for the inorganic intermediate layer, with index of refraction (n) and absorption constant (k) values optimized to minimize reflectivity, sometimes in combination with an organic underlayer.

The present invention encompasses a novel multiple exposure scheme which is useful in lithographic processes. In carrying out the present invention, conventional materials and processing techniques can be employed and, hence, such conventional aspects are not set forth herein in detail. For example, etching of the underlying dielectric or patterning layer is conducted in a conventional manner. One having ordinary skill in the art could easily select suitable photoresist materials and etchants, and employ suitable deposition and etching techniques.

As stated above, resolution limits dictated by the Rayleigh criterion suggest that optical lithography is reaching its limits. To achieve higher resolution without decreasing the exposure wavelength or increasing the numerical aperture, more aggressive resolution enhancement techniques are required. An expensive, but effective RET is double exposure techniques. Several types of double exposure techniques exist: pitch splitting (K. Monahan "Enabling Immersion Lithography and Double Patterning" Proc SPIE 6518, 2007), pack and unpack (Owe-Yang, supra), and a variety of techniques that decompose 2D features into 1D structures (for example, Nakamura et al. "Contact Hole Formation by Multiple Exposure Technique in Ultra-low k1 Lithography," Proceedings of SPIE, Vol. 5377, p. 255, 2004). The invention discussed herein describes a low cost method for any of the above double exposure schemes with a novel patterning stack.

In summary, in the present invention, we perform conventional lithography utilizing an appropriate film stack to be patterned, preferably coated with an appropriate optical anti-reflective coating, and finally coated with a conventional photoresist. The photoresist is imaged using conventional optical lithography processes known in the art. An immersion topcoat and/or top antireflective coating can also be utilized if necessary. Then the post-litho photoresist image is overcoated with a planarizing, etch selective polymeric coating. Next, a second photoresist is coated and imaged on top of the etch selective coating, utilizing conventional lithographic imaging. Again, a bottom or top antireflective coating, or immersion protective topcoat can be utilized if necessary. Finally, an integrated reactive ion etch is performed in which both the second and first lithographic images are transferred into the underlying film stack. It's possible to utilize several embodiments of this scheme to achieve a wide variety of double exposure schemes.

The first imaging layer and the second imaging layer can be chosen from a wide array of high performance, commercially available photoresists. The intermediate, etch selective overcoat layer preferably has the following properties: (a) etch selectivity to the photoresist of >3:1, (b) refractive index equivalent, or close to that of each photoresist. For a 193 nm lithography application, a typical photoresist refractive index at the actinic wavelength is ~n=1.7 and k~0.02, where n is the real part of the refractive index, and k, the extinction coefficient, is the imaginary part of the refractive index. Preferably, the index of refraction of the intermediate overcoat polymer and formulation is matched to the photoresist, having a range of n=1.5-1.8, and k=0-0.3 for typical 193 nm lithographic applications; (c) adequate gap filling and planarization properties, (d) a solubility switching mechanism, or solubility differences from both photoresist layers, (e) a composition that yields the etch selectivity of (a).

In other aspects, the invention comprise a process for enhancing photolithography resolution for patterning a substrate, the substrate being covered with a patterning layer comprising the steps of:
   (a) exposing and developing a first photoresist layer on the patterning layer to obtain a first structure comprising a first set of patterned features on the patterning layer;
   (b) applying an etch selective overcoat material over the first structure;
   (c) applying a second photoresist layer on the etch selective overcoat material;
   (d) patterning the second photoresist layer with a second set of patterned features that project between the first set of patterned features;
   (e) after the step (d), forming an immersion top coating on top of the first structure and the second photoresist layer, followed by exposing and developing the second photoresist layer to obtain a second structure comprising a second set of patterned features on the etch selective overcoat material corresponding to the second set of patterned features that project between the first set of patterned features;
   (f) selectively removing the etch selective overcoat material to form an etch selective overcoat material corresponding to and extending as a part of the second set of patterned features that project between the first set of patterned features and onto the patterning layer;
   (g) selectively removing the patterning layer to provide a pattern on the substrate that corresponds to the first set of patterned features and the overcoat material corresponding to and extending as a part of the second set of patterned features;
   (h) selectively removing the first set of patterned features and the overcoat material corresponding to and extending as a part of the second set of patterned features to form a pattern on the substrate that corresponds to the first set of patterned features and the second set of patterned features wherein the etch selective overcoat material comprises a silicon polymer layer formed over the first structure;

The foregoing steps of exposing and developing a first photoresist layer on the patterning layer to obtain a first structure and the exposing and developing the second photoresist layer to obtain a second structure can be implemented through a mask comprising a dark field mask or a bright field mask; or the steps of exposing and developing a first photoresist layer is effected through a mask comprising a dark field mask, and the exposing and developing the second photoresist layer is effected through a mask comprising a bright field mask; or the steps of exposing and developing a first photoresist layer is effected through a mask comprising a bright field mask, and the exposing and developing the second photoresist layer is effected through a mask comprising a dark field mask. This process may also comprise applying a bottom antireflective coating under the first structure.

Furthermore, the foregoing etch selective overcoat may comprise an overcoat having antireflective properties; or an organic coating and further comprising cross linking the organic coating.

Additionally, the foregoing substrate may comprise a semiconductor device, and in an additional embodiment, the foregoing steps (a) through (h) may be performed to form a via structure in the semiconductor device; or a dual damascene semiconductor device; or a gate structure in a CMOS device. Further in this respect, the substrate may comprise a semiconductor device and an optical communication device and the steps (a) through (h) are performed to form an interconnect structure between the semiconductor device and the optical communication device.

In additional embodiments of the foregoing process the etch selective overcoat material may be applied on the first set of patterned features by means of a spin on process. Additionally; the first photoresist layer may comprise an organic photoresist material, the second photoresist layer may comprise an organic photoresist material, and the first organic photoresist material may be the same or different than the second photoresist material.

Also, in the foregoing process, the silicon polymer may comprises a polymer containing moieties selected from siloxane. silsesquioxane and carbosilane moieties. Additionally, the first photoresist layer may comprise a silicon containing photoresist, the second photoresist layer may comprise a silicon containing photoresist, and the first silicon containing photoresist material may be the same or different than the second silicon containing photoresist material.

The process described above can include steps comprising forming the etch selective overcoat material from a first organic layer over the first structure in combination with a first inorganic layer on top of the first organic layer where the first photoresist comprises a silicon containing photoresist, and the second photoresist comprises an organic photoresist. In this process, the first inorganic layer may comprise a silicon containing intermediate layer.

Throughout this specification, and the drawings we have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compounds, compositions conditions, processes, structures and the like in any ratios.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and ranges falling within any of these ranges.

The term "about" or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five percent, ten percent, or 15 percent, or somewhat higher or lower than the upper limit of five percent, ten percent, or 15 percent. The term "up to" that defines numerical parameters means a lower limit comprising zero or a miniscule number, e.g., 0.001. The terms "about," "substantial" and "substantially" mean that which is largely or for the most part entirely specified. The inventors also employ the terms "substantial," "substantially," and "about" in the same way as a person with ordinary skill in the art would understand them or employ them. The terms "written description," "specification," "claims," "drawings," and "abstract" as used herein refer to the written description, specification, claims, drawings, and abstract of the present application as originally filed, and if not specifically stated herein, the written description, specification, claims, drawings, and abstract of the present application as subsequently amended.

All scientific journal articles and other articles as well as issued and pending patents that this written description mentions including the references cited in such scientific journal articles and other articles, and such patents, are incorporated herein by reference in their entirety for the purpose cited in this written description and for all other disclosures contained in such scientific journal articles and other articles as well as patents and the aforesaid references cited therein, as all or any one may bear on or apply in whole or in part, not only to this written description, but also the abstract, claims, and appended drawings of this application.

Although the inventors have described their invention by reference to some embodiments, other embodiments defined by the doctrine of equivalents are intended to be included as falling within the broad scope and spirit of the foregoing written description, drawings, abstract of the disclosure, and claims.

We claim:

1. A process for enhancing photolithography resolution for patterning a substrate, said substrate being covered with a patterning layer comprising the steps of:
   (a) exposing and developing a first photoresist layer on said patterning layer to obtain a first structure comprising a first set of patterned features on said patterning layer;
   (b) applying an etch selective overcoat material over said first structure;
   (c) applying a second photoresist layer on said etch selective overcoat material;
   (d) patterning said second photoresist layer with a second set of patterned features that project between said first set of patterned features;
   (e) after said step (d), forming an immersion top coating on top of said first structure and said second photoresist layer, followed by exposing and developing said second photoresist layer to obtain a second structure comprising a second set of patterned features on said etch selective overcoat material corresponding to said second set of patterned features that project between said first set of patterned features;
   (f) selectively removing said etch selective overcoat material to form an etch selective overcoat material corresponding to and extending as a part of said second set of patterned features that project between said first set of patterned features and onto said patterning layer;
   (g) selectively removing said patterning layer to provide a pattern on said substrate that corresponds to said first set of patterned features and said overcoat material corresponding to and extending as a part of said second set of patterned features;
   (h) selectively removing said first set of patterned features and said overcoat material corresponding to and extending as a part of said second set of patterned features to form a pattern on said substrate that corresponds to said first set of patterned features and said second set of patterned features wherein said etch selective overcoat material comprises a silicon polymer layer formed over said first structure.

2. The process of claim 1, wherein said exposing and developing a first photoresist layer on said patterning layer to obtain a first structure and said exposing and developing said second photoresist layer to obtain a second structure are implemented through a mask comprising a dark field mask.

3. The process of claim 1, wherein said exposing and developing a first photoresist layer on said patterning layer to obtain a first structure and said exposing and developing said second photoresist layer to obtain a second structure are implemented through a mask comprising a bright field mask.

4. The process of claim 1 where said exposing and developing a first photoresist layer is effected through a mask comprising a dark field mask, and said exposing and developing said second photoresist layer is effected through a mask comprising a bright field mask.

5. The process of claim 1 where said exposing and developing a first photoresist layer is effected through a mask comprising a bright field mask, and said exposing and developing said second photoresist layer is effected through a mask comprising a dark field mask.

6. The process of claim 1, wherein said etch selective overcoat comprises an overcoat having antireflective properties.

7. The process of claim 1 said etch selective overcoat comprises an organic coating and further comprising cross linking said organic coating.

8. The process of claim 1, wherein said substrate comprises a semiconductor device.

9. The process of claim 1 wherein said substrate comprises a semiconductor device, and said steps (a) through (h) are performed to form a via structure in said semiconductor device.

10. The process of claim 1 wherein-said steps (a) through (h) are performed to form a dual damascene semiconductor device.

11. The process of claim 1 wherein said substrate comprises a CMOS device, and said steps (a) through (h) are performed to form a gate structure in said CMOS device.

12. The process of claim 1 wherein said substrate comprises a semiconductor device and an optical communication device and said steps (a) through (h) are performed to form an interconnect structure between said semiconductor device and said optical communication device.

13. The process of claim 1, wherein said etch selective overcoat material is applied on said first set of patterned features by means of a spin on process.

14. The process of claim 1, wherein:
said first photoresist layer comprises an organic photoresist material;
said second photoresist layer comprises an organic photoresist material, and wherein said first organic photoresist material may be the same or different than said second photoresist material.

15. The process of claim 1, wherein said silicon polymer comprises a polymer containing moieties selected from siloxane. silsesquioxane and carbosilane moieties.

16. The process of claim 1, wherein:
said first photoresist layer comprises a silicon containing photoresist;
said second photoresist layer comprises a silicon containing photoresist, and wherein said first silicon containing photoresist material may be the same or different than said second silicon containing photoresist material.

17. The process of claim 1, comprising:
a. forming said etch selective overcoat material from a first organic layer over said first structure in combination with a first inorganic layer on top of said first organic layer;
b. said first photoresist comprises a silicon containing photoresist; and
c. said second photoresist comprises an organic photoresist.

18. The process of claim 17 wherein said first inorganic layer is a silicon containing intermediate layer.

19. The process of claim 1, comprising applying a bottom antireflective coating under said first structure.

* * * * *